(12) United States Patent
Wei et al.

(10) Patent No.: US 12,082,460 B2
(45) Date of Patent: Sep. 3, 2024

(54) DISPLAY SUBSTRATE AND MANUFACTURING METHOD THEREOF, AND DISPLAY APPARATUS

(71) Applicants: Chengdu BOE Optoelectronics Technology Co., Ltd., Chengdu (CN); BOE TECHNOLOGY GROUP CO., LTD., Beijing (CN)

(72) Inventors: Yulong Wei, Beijing (CN); Zhiwen Chu, Beijing (CN); Fuqiang Yang, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 486 days.

(21) Appl. No.: 17/430,229

(22) PCT Filed: Feb. 27, 2020

(86) PCT No.: PCT/CN2020/076951
§ 371 (c)(1),
(2) Date: Aug. 11, 2021

(87) PCT Pub. No.: WO2021/168731
PCT Pub. Date: Sep. 2, 2021

(65) Prior Publication Data
US 2022/0310756 A1 Sep. 29, 2022

(51) Int. Cl.
*H01L 27/32* (2006.01)
*G09G 3/3225* (2016.01)
(Continued)

(52) U.S. Cl.
CPC ......... *H10K 59/131* (2023.02); *G09G 3/3225* (2013.01); *H01L 27/124* (2013.01);
(Continued)

(58) Field of Classification Search
CPC ................... H10K 59/131; G09G 2300/0426
See application file for complete search history.

(56) References Cited

U.S. PATENT DOCUMENTS

| 10,354,578 B2 | 7/2019 | Ka et al. |
| 10,644,038 B2 | 5/2020 | Wang et al. |
| (Continued) | | |

FOREIGN PATENT DOCUMENTS

| CN | 107993581 A | 5/2018 |
| CN | 108646477 A | 10/2018 |
| (Continued) | | |

OTHER PUBLICATIONS

Written Opinion in PCT/CN2020/076951 dated Nov. 30, 2020 in English.
(Continued)

*Primary Examiner* — John A Bodnar
(74) *Attorney, Agent, or Firm* — Collard & Roe, P.C.

(57) ABSTRACT

Disclosed are a display substrate, a manufacturing method thereof and a display apparatus. The display region of the display substrate includes an opening, and a first display region and a second display region located at opposite sides of the opening, and the peripheral region includes an opening peripheral region at least partially located in the opening. The display substrate further includes a first wire and a second wire arranged on a same layer; the first wire and the second wire pass through the first display region, the opening peripheral region and the second display region, sequentially; in the opening peripheral region, the first wire includes a first bent portion, the second wire includes a second bent portion, and the first bent portion and the second bent portion are arranged side by side along the first direction.

18 Claims, 14 Drawing Sheets

(51) Int. Cl.
  *H01L 27/12*     (2006.01)
  *H10K 59/131*    (2023.01)
(52) U.S. Cl.
  CPC ............ *G09G 2300/0426* (2013.01); *G09G 2310/0264* (2013.01)

(56)         References Cited

U.S. PATENT DOCUMENTS 11,004,377  B2*  5/2021  Morita .............. H10K 59/131
  2018/0166018  A1   6/2018  Yang
  2019/0096914  A1*  3/2019  Hosokawa .......... G09G 3/3677
  2019/0181213  A1*  6/2019  Lim ................. H10K 59/122

FOREIGN PATENT DOCUMENTS

IN     107301831  A    10/2017
  WO     2019082469  A1    5/2019

OTHER PUBLICATIONS

Chinese International Search Report in PCT/CN2020/076951 dated Nov. 30, 2020 with English translation.
Written Opinion in PCT/CN2020/076951 dated Nov. 30, 2020 in Chinese.
Extended European Search Report in European Application No. 20920758.8 dated Mar. 16, 2023.

* cited by examiner

DISPLAY SUBSTRATE AND MANUFACTURING METHOD THEREOF, AND DISPLAY APPARATUS

CROSS REFERENCE TO RELATED APPLICATIONS

This application is the National Stage of PCT/CN2020/076951 filed on Feb. 27, 2020, the disclosure of which is incorporated by reference.

TECHNICAL FIELD

Embodiments of the present disclosure relate to a display substrate, a manufacturing method thereof, and a display apparatus.

BACKGROUND

At present, the display screen of a display device is developing towards large screen and full screen. Generally, a display device (such as a mobile phone, a tablet computer, etc.) has a camera (or an imaging device), and the camera is usually arranged at an outer side of the display region of the display screen. However, because the installation of the camera requires a certain space, it is not conducive to the full-screen and narrow-frame design of the display screen. For example, the camera can be combined with the display region of the display screen, and a place can be reserved for the camera in the display region, so as to maximize the display region of the display screen.

SUMMARY

At least one embodiment of the present disclosure provides a display substrate, which includes a display region and a peripheral region at least partially surrounding the display region. The display region includes an opening, a first display region and a second display region, the first display region and the second region are located at opposite sides of the opening, the first display region, the opening and the second display region are sequentially arranged along a first direction, and the peripheral region includes an opening peripheral region at least partially located in the opening; the display substrate further includes a first wire and a second wire, the first wire and the second wire are arranged on a same layer, and the first wire and the second wire are configured to transmit electrical signals for the display region; the first wire and the second wire pass through the first display region, the opening peripheral region and the second display region, sequentially; and in the opening peripheral region, the first wire includes a first bent portion, the second wire includes a second bent portion, and the first bent portion and the second bent portion are arranged side by side along the first direction.

For example, in the display substrate provided by at least one embodiment of the present disclosure, the first bent portion includes at least one S-shaped bent portion; or the second bent portion includes at least one S-shaped bent portion; or each of the first bent portion and the second bent portion includes at least one S-shaped bent portion.

For example, in the display substrate provided by at least one embodiment of the present disclosure, the first display region and the second display region include a plurality of rows of sub-pixels separated by the opening, the first wire is configured to provide a scan signal for a first row of sub-pixels arranged in the first direction in the first display region and the second display region, and the second wire is configured to provide a scan signal for a second row of sub-pixels arranged in the first direction in the first display region and the second display region.

For example, in the display substrate provided by at least one embodiment of the present disclosure, the opening peripheral region further includes a semiconductor pattern and a conductive pattern; the semiconductor pattern is located on a base substrate, the first wire and the second wire are located on a side of the semiconductor pattern away from the base substrate, and the conductive pattern is located on a side of the first wire and the second wire away from the semiconductor pattern; and in a direction perpendicular to the base substrate, the first wire is spaced apart and insulated from at least one of the semiconductor pattern and the conductive pattern to be capable of forming a capacitor, and the second wire is spaced apart and insulated from at least one of the semiconductor pattern and the conductive pattern to be capable of forming a capacitor.

For example, in the display substrate provided by at least one embodiment of the present disclosure, in the direction perpendicular to the base substrate, the first bent portion of the first wire is spaced apart and insulated from at least one of the semiconductor pattern and the conductive pattern to be capable of forming a capacitor, and the second bent portion of the second wire is spaced apart and insulated from at least one of the semiconductor pattern and the conductive pattern to be capable of forming a capacitor.

For example, the display substrate provided by at least one embodiment of the present disclosure further includes a third wire, which is arranged on a same layer as the first wire and the second wire, the third wire passes through the first display region, the opening peripheral region and the second display region, sequentially, and the third wire extends along the first direction, and is configured to provide a scan signal for a third row of pixels arranged along the first direction in the first display region and the second display region, and the third wire is spaced apart and insulated from at least one of the semiconductor pattern and the conductive pattern to be capable of forming a capacitor.

For example, in the display substrate provided by at least one embodiment of the present disclosure, a count of sub-pixels included in the third row of sub-pixels is greater than a count of sub-pixels included in the first row of sub-pixels; or the count of sub-pixels included in the third row of sub-pixels is greater than a count of sub-pixels included in the second row of sub-pixels; or the count of sub-pixels included in the third row of sub-pixels is greater than the count of sub-pixels included in the first row of sub-pixels, and greater than the count of sub-pixels included in the second row of sub-pixels.

For example, the display substrate provided by at least one embodiment of the present disclosure, the display region further includes a third display region, and two opposite edges, extending along a second direction perpendicular to the first direction, of the third display region, are respectively aligned with an edge, extending along the second direction and away from the opening, of the first display region and an edge, extending along the second direction and away from the opening, of the second display region; and the third display region includes a plurality of sub-pixels arranged in multiple rows and multiple columns, and further includes a plurality of fourth wires extending along the first direction, and each of the plurality of fourth wires is configured to provide a scan signal for each row of sub-pixels among the multiple rows and multiple columns of sub-pixels.

For example, in the display substrate provided by at least one embodiment of the present disclosure, a count of sub-pixels included in each row of sub-pixels among the multiple rows and multiple columns of sub-pixels is greater than a count of sub-pixels included in the first row of sub-pixels, greater than a count of sub-pixels included in the second row of sub-pixels, and greater than a count of sub-pixels included in the third row of sub-pixels.

For example, in the display substrate provided by at least one embodiment of the present disclosure, the semiconductor pattern includes a plurality of semiconductor lines extending along a second direction, the second direction is perpendicular to the first direction, and the conductive pattern is continuously arranged on a side of the first wire and the second wire away from the semiconductor pattern.

For example, the display substrate provided by at least one embodiment of the present disclosure further includes a first insulating layer and a second insulating layer, the first insulating layer is located on a side of the semiconductor pattern away from the base substrate, the first wire and the second wire are located on a side of the first insulating layer away from the semiconductor pattern; the second insulating layer is located on a side of the first wire and the second wire away from the first insulating layer; a via hole is provided in the first insulating layer and the second insulating layer, and the semiconductor pattern and the conductive pattern are electrically connected through the via hole in the first insulating layer and the second insulating layer.

For example, in the display substrate provided by at least one embodiment of the present disclosure, the display region includes a plurality of sub-pixels, and each of the plurality of sub-pixels includes a pixel circuit, the pixel circuit includes a thin film transistor and a storage capacitor, the thin film transistor includes an active layer, a gate electrode and source-drain electrodes, and the storage capacitor includes a first capacitor plate and a second capacitor plate; and the gate electrode is arranged on a same layer as the first capacitor plate, and the first wire and the second wire are arranged on a same layer as the second capacitor plate.

For example, in the display substrate provided by at least one embodiment of the present disclosure, the semiconductor pattern is arranged on a same layer as the active layer, and the conductive pattern is arranged on a same layer as the source-drain electrodes.

For example, in the display substrate provided by at least one embodiment of the present disclosure, the opening peripheral region further includes a power pattern electrically connected to the conductive pattern, the power pattern is configured to provide an electrical signal for the conductive pattern, and the display region further includes a first power line electrically connected to the pixel circuit, and the power pattern and the first power line are arranged on a same layer.

For example, in the display substrate provided by at least one embodiment of the present disclosure, the opening peripheral region further includes a power pattern electrically connected to the conductive pattern, the power pattern is configured to provide an electrical signal for the conductive pattern, each of the plurality of sub-pixels further includes a light emitting element, the light emitting element includes a cathode, an anode, and a light emitting layer between the cathode and the anode, and one of the cathode and the anode is electrically connected to the pixels circuit, and the power pattern and the anode are arranged on a same layer.

At least one embodiment of the present disclosure provides a display apparatus, which includes any one of the display substrates described above.

At least one embodiment of the present disclosure provides a manufacturing method of a display substrate, which includes forming a display region and a peripheral region at least partially surrounding the display region. An opening, a first display region, and a second display region are formed in the display region, and the first display region and the second display region are formed at opposite sides of the opening; the first display region, the opening and the second display region are sequentially arranged along a first direction, and the peripheral region includes an opening peripheral region at least partially located in the opening; the display substrate further includes a first wire and a second wire, the first wire and the second wire are arranged on a same layer, and the first wire and the second wire are configured to transmit electrical signals for the display region; the first wire and the second wire pass through the first display region, the opening peripheral region and the second display region, sequentially; and in the opening peripheral region, the first wire includes a first bent portion, the second wire includes a second bent portion, and the first bent portion and the second bent portion are arranged side by side along the first direction.

For example, in the manufacturing method of the display substrate provided by at least one embodiment of the present disclosure, the first bent portion is formed to include at least one S-shaped bent portion; or the second bent portion is formed to include at least one S-shaped bent portion; or each of the first bent portion and the second bent portion is formed to include at least one S-shaped bent portion.

For example, in the manufacturing method of the display substrate provided by at least one embodiment of the present disclosure, forming the opening peripheral region further includes forming a semiconductor pattern and a conductive pattern; the semiconductor pattern is formed on a base substrate, the first wire and the second wire are formed on a side of the semiconductor pattern away from the base substrate, and the conductive pattern is formed on a side of the first wire and the second wire away from the semiconductor pattern; and in a direction perpendicular to the base substrate, the first bent portion of the first wire is spaced apart and insulated from at least one of the semiconductor pattern and the conductive pattern to be capable of forming a capacitor, and the second bent portion of the second wire is spaced apart and insulated from at least one of the semiconductor pattern and the conductive pattern to be capable of forming a capacitor.

For example, in the manufacturing method of the display substrate provided by at least one embodiment of the present disclosure, the forming the display region includes forming a pixel circuit, the pixel circuit includes a thin film transistor and a storage capacitor, the thin film transistor includes an active layer, a gate electrode and source-drain electrodes, and the storage capacitor includes a first capacitor plate and a second capacitor plate; and the gate electrode is formed on a same layer as the first capacitor plate, the first wire and the second wire are formed on a same layer as the second capacitor plate, the semiconductor pattern is formed on a same layer as the active layer, and the conductive pattern is formed on a same layer as the source-drain electrodes.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

In order to make objects, technical details and advantages of the embodiments of the present disclosure apparent, the technical solutions of the embodiments of the present disclosure will be described in a clearly and fully understandable way in connection with the drawings related to the embodiments of the present disclosure. Apparently, the described embodiments are just a part but not all of the embodiments of the disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1A:
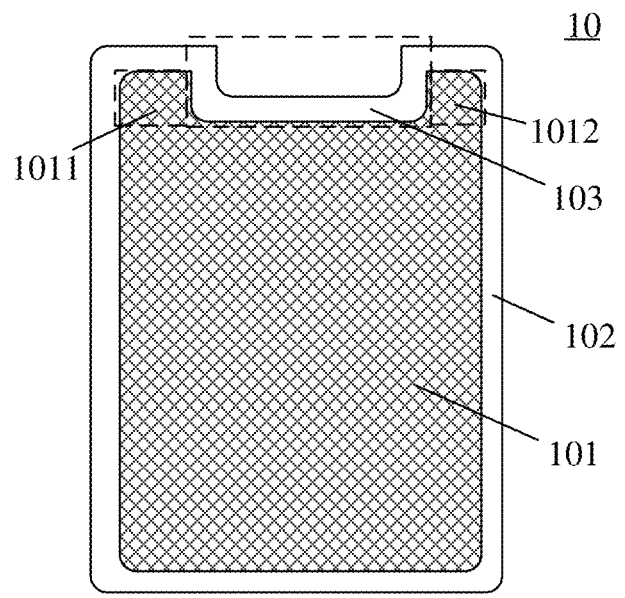
FIG. 1A is a planar view of a display substrate.

FIG. 1A is a planar view of a display substrate. As shown in FIG. 1A, the display substrate 10 includes a display region 101 and a peripheral region 102 surrounding the display region 101. The display region 101 is designed as, for example, an irregular shape with a notch 103 on at least one side; an element, such as a camera, a distance sensor, etc., can be arranged in the region of the notch 103 on the display substrate 10, thereby facilitating a narrow-frame design of the display substrate 10.

As shown in FIG. 1A, the display region 101 includes a first sub-display region 1011 and a second sub-display region 1012 which are respectively located on the left and right sides of the notch 103. The first sub-display region 1011 and the second sub-display region 1012 are at the same horizontal position relative to the bottom edge (the lower edge in the figure) of the display region 101. For example, the first sub-display region 1011 and the second sub-display region 1012 are driven by the same one or more scan signal lines (gate lines) horizontally extending along left-right direction in the figure. Due to the existence of the notch 103, the number of sub-pixels in a same row of sub-pixels in the first sub-display region 1011 and the second sub-display region 1012 is less than the number of sub-pixels in a same row of sub-pixels in a part (e.g., the intermediate part in the figure) of the display region 101 other than the first sub-display region 1011 and the second sub-display region 1012. Therefore, in the display substrate 10, the number of sub-pixels connected to a signal line which extends horizontally and is configured to provide an electrical signal (e.g., a scan signal) for the sub-pixels in a same row in the first sub-display region 1011 and the second sub-display region 1012 is different from the number of sub-pixels connected to a signal line which extends horizontally and is configured to provide an electrical signal (e.g., a scan signal) for the sub-pixels in a same row in a part of the display region 101 other than the first sub-display region 1011 and the second sub-display region 1012; and in the case where the notch 103 has an irregular shape (e.g., a trapezoid shape), the numbers of sub pixels in different rows of sub-pixels in the first sub-display region 1011 and the second sub-display region 1012 may also be different. Therefore, in the display substrate 10, because the numbers of sub-pixels of different rows of sub-pixels are different, loads of the signal lines connected to different rows of sub-pixels are different, and then the signal transmission speeds of these signal lines are different, which will affect the display effect of the display substrate.

For example, load compensation can be performed on these signal lines with different loads, so that the loads of these signal lines are basically the same. For example, a certain number of compensation units which have a capacitor structure can be provided for these signal lines to make loads of the signal lines reach an ideal value.

Figure 1B:
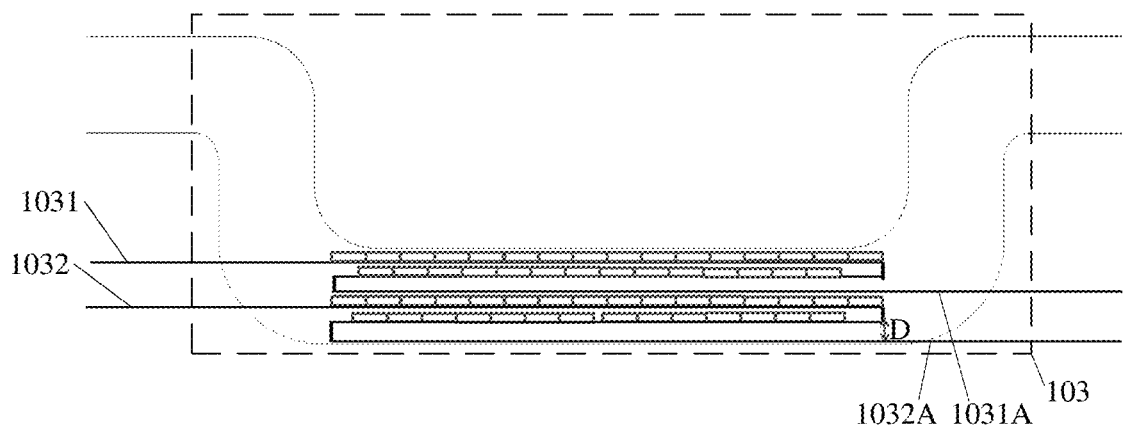
FIG. 1B is a partial enlarged view of the display substrate in FIG. 1A.

As shown in FIG. 1B, in order not to affect the display effect of the display region 101, compensation units, which provide load compensation for the wire 1031 and the wire 1032 and have a capacitor structure, are usually arranged on the peripheral region between the first display region 1011 and the second display region 1012. In order to achieve a narrow-frame design of the display substrate, the size of the peripheral region needs to be as small as possible, and in this case, if the wire 1031 and the wire 1032 are arranged linearly, the arrangement space of compensation units is small, so that the number of compensation units being provided may not be enough to meet the requirement. In this regard, the wire 1031 and the wire 1032 may be bent in the peripheral region to increase the extension lengths of the wire 1031 and of the wire 1032, thereby increasing the arrangement space of compensation units.

For example, the wire 1031 and the wire 1032 can be arranged in a bent way according to the manner shown in FIG. 1B, and compensation units can be provided on the bent portions of the wire 1031 and the wire 1032. For example, in the example shown in FIG. 1B, each rectangular frame on the wire 1031 or the wire 1032 represents a compensation unit. In some cases, as shown in FIG. 1B, providing two rows of compensation units for each of the wire 1031 and the wire 1032 can achieve the compensation requirement, and in this case, there will be an extra row of wire portion not provided with the compensation unit, as shown by the line portions 1031A and 1032A in FIG. 1B. Due to process limitations and the reliability of wires, a certain distance D is required between adjacent wires, and this distance D is usually difficult to be reduced, so the existence of the wire portions 1031A and 1032A reduces the utilization of space, which is not conducive to a narrow-frame design.

At least one embodiment of the present disclosure provides a display substrate, a manufacturing method thereof and a display apparatus. The display substrate includes a display region and a peripheral region at least partially surrounding the display region. The display region includes an opening, a first display region and a second display region; the first display region and the second display region are located at opposite sides of the opening; the first display region, the opening and the second display region are sequentially arranged along a first direction, and the peripheral region includes an opening peripheral region at least partially located in the opening. The display substrate further includes a first wire and a second wire, the first wire and the second wire are arranged on a same layer, and the first wire and the second wire are configured to transmit electrical signals for the display region. The first wire and the second wire pass through the first display region, the opening peripheral region, and the second display region, sequentially. In the opening peripheral region, the first wire includes a first bent portion, the second wire includes a second bent portion, and the first bent portion and the second bent portion are arranged side by side in the first direction. The wire arrangement manner of the display substrate can reduce the space occupied by wires in the opening peripheral region, thereby facilitating a narrow-frame and large-screen design of the display substrate.

Hereinafter, the display substrate, the manufacturing method thereof and the display apparatus according to some embodiments of the present disclosure will be described through several specific implementations.

Figure 2A:
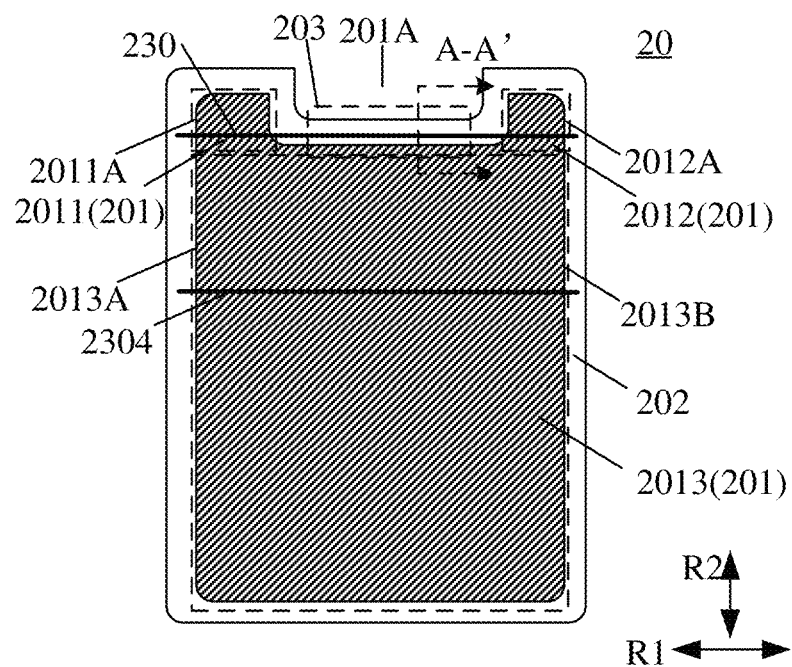
FIG. 2A is a planar view of a display substrate provided by some embodiments of the present disclosure.
Figure 2B:
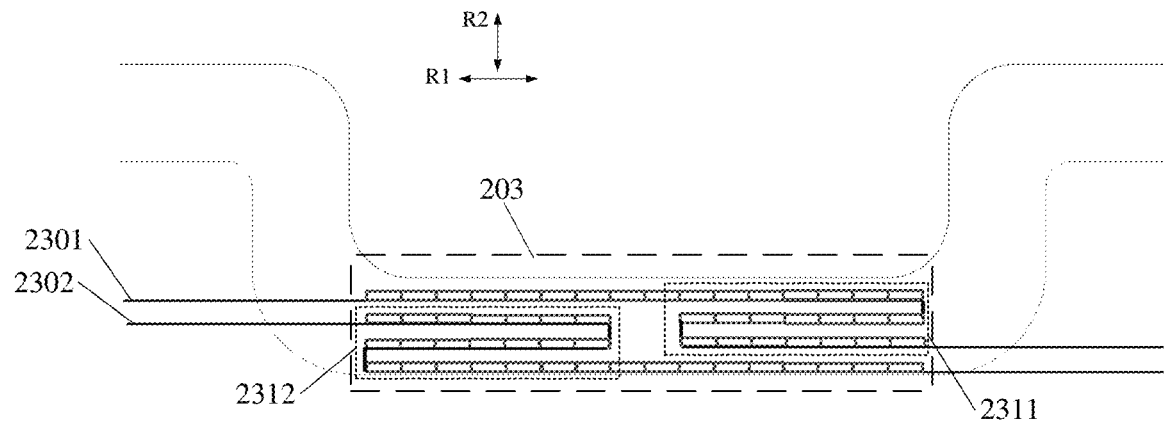
FIG. 2B is a partial enlarged view of the display substrate in FIG. 2A.

At least one embodiment of the present disclosure provides a display substrate. FIG. 2A shows a planar view of the display substrate, and FIG. 2B shows a partial enlarged view of the display substrate. As shown in FIG. 2A and FIG. 2B, the display substrate 20 includes a display region 201 and a peripheral region 202 at least partially surrounding the display region 201. The display region 201 includes sub-pixels arranged in an array and various wires serving the sub-pixels, so as to realize the display function. The peripheral region 202 includes wires and contact pads, etc., which are electrically connected to the sub-pixels, and the wires in the peripheral region are electrically connected with the wires (e.g., gate lines, data lines, etc.) in the display region to provide electrical signals (e.g., scan signals, data signals, etc.) for the sub-pixels.

For example, the display region 201 includes an opening 201A, a first display region 2011 and a second display region 2012; the first display region 2011 and the second region 2012 are located at opposite sides (the left and right sides as shown in the figure) of the opening 201A; and the first display region 2011, the opening 201A and the second display region 2012 are sequentially arranged along a first direction R1 (a horizontal direction in the figure). The peripheral region 202 includes an opening peripheral region 203 at least partially located in the opening 201A. For example, the opening peripheral region 203 is located between the first display region 2011 and the second display region 2012.

For example, the display substrate 20 further includes a plurality of wires 230 (one wire is shown as an example in FIG. 2A) arranged on a same layer, and the plurality of wires 230 are configured to transmit electrical signals for the display region 201. A plurality of wires 230 pass through the first display region 2011, the opening peripheral region 203 and the second display region 2012, sequentially, so as to electrically connect the sub-pixels in the first display region 2011 and the second display region 2012 which are respectively located at opposite sides of the opening 201A. For example, a wire among the wires 230 provides an electrical signal for sub-pixels, which are at a same horizontal line as the opening peripheral region 203, in the display region 201. The electrical signal can be an electrical signal in any form, such as a scan signal, a light emitting control signal or a reset signal, etc. That is, the electrical signal can be one or more of a scan signal, a light emitting control signal, a reset signal, etc., which are used for the pixel driving circuit in the display region 201.

For example, in some embodiments, as shown in FIG. 2B, the plurality of wires 230 include a first wire 2301 and a second wire 2302. The first wire 2301 and the second wire 2302 pass through the first display region 2011, the opening peripheral region 203 and the second display region 2012, sequentially in a non-linear manner. In the opening peripheral region 203, the first wire 2301 includes a first bent portion 2311, the second wire 2302 includes a second bent portion 2312, and the first bent portion 2311 and the second bent portion 2312 are arranged side by side in the first direction R1. In this case, different parts of a straight line extending along the first direction R1 pass through the first bent portion 2311 and the second bent portion 2312 at the same time.

Therefore, compared with the wire arrangement shown in FIG. 1B, the wire arrangement manner described above can enable each wire 230 to reduce the wire arrangement space under the condition of obtaining sufficient load compensation, thereby facilitating a narrow-frame and large-screen design of the display substrate 20.

For example, in some embodiments, the first bent portion 2311 includes at least one S-shaped bent portion; or, the second bent portion 2312 includes at least one S-shaped bent portion; or, each of the first bent portion 2311 and the second bent portion 2312 includes at least one S-shaped bent portion. For example, the number of S-shaped bent portions included in the first bent portion 2311 and the number of S-shaped bent portions included the second bent portion 2312 can be determined according to the magnitude of the load needed to be compensated for the first wire 2301 and the magnitude of the load needed to be compensated for the second wire 2302. For example, in the case where the load compensation that can be set in the space provided by an S-shaped bent portion is not enough to meet the compensation requirement, the first bent portion 2311 and the second bent portion 2312 can include a plurality of S-shaped bent portions to increase the arrangement space for loads.

For example, in some embodiments, the first display region 2011 and the second display region 2012 include a plurality of rows of sub-pixels separated by the opening 201A, and the plurality of rows of sub-pixels in the first display region 2011 are in one-to-one correspondence with the plurality of rows of sub-pixels in the second display region 2012. For example, the n-th row (n is a positive integer) of sub-pixels in the first display region 2011 corresponds to the n-th row of sub-pixels in the second display region 2012, and from the perspective of display effect, the n-th row of sub-pixels in the first display region 2011 and the n-th row of sub-pixels in the second display region 2012 are located in a same row, so that in the present disclosure the n-th row of sub-pixels in the first display region 2011 and the n-th row of sub-pixels in the second display region 2012 are regarded as a same row of sub-pixels in the display region 201. For example, the first wire 2301 provides an electrical signal, such as a scan signal, for the first row of sub-pixels arranged along the first direction R1 in the first display region 2011 and the second display region 2012, and the second wire 2302 provides an electrical signal, such as a scan signal, for the second row of sub-pixels arranged along the first direction R1 in the first display region 2011 and the second display region 2012. In this case, the first wire 2301 and the second wire 2302 are scan signal lines (i.e., gate lines) that provide scan signals for different rows of sub-pixels in the display region.

Figure 3:
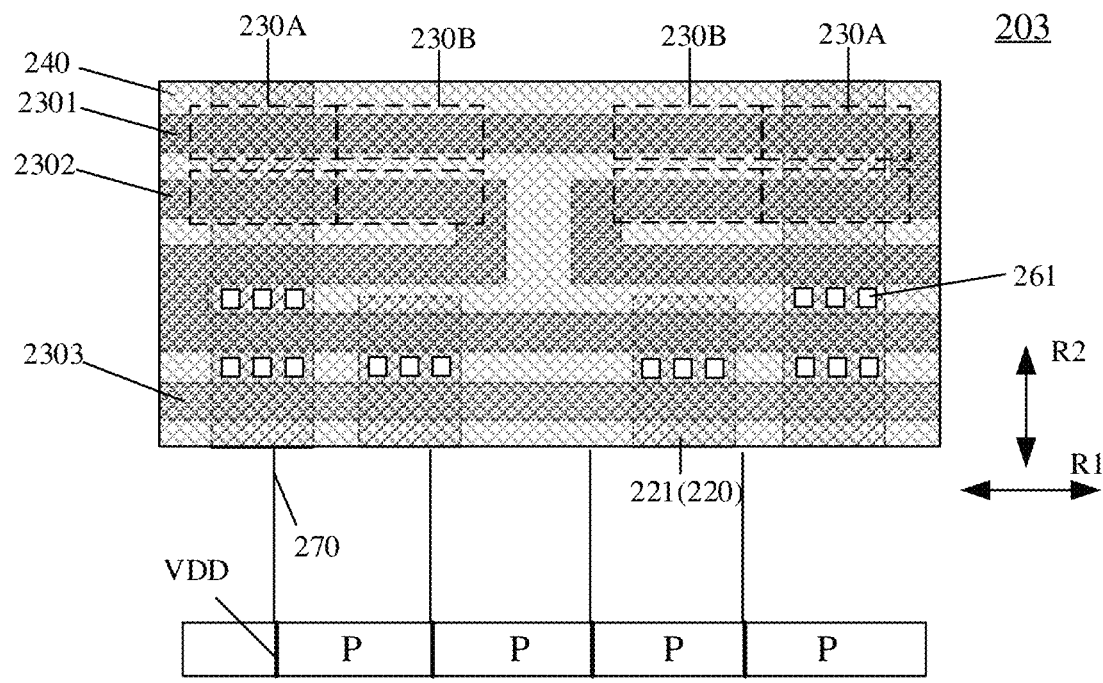
FIG. 3 is a planar view of an opening peripheral region of a display substrate provided by at least one embodiment of the present disclosure.
Figure 5A:
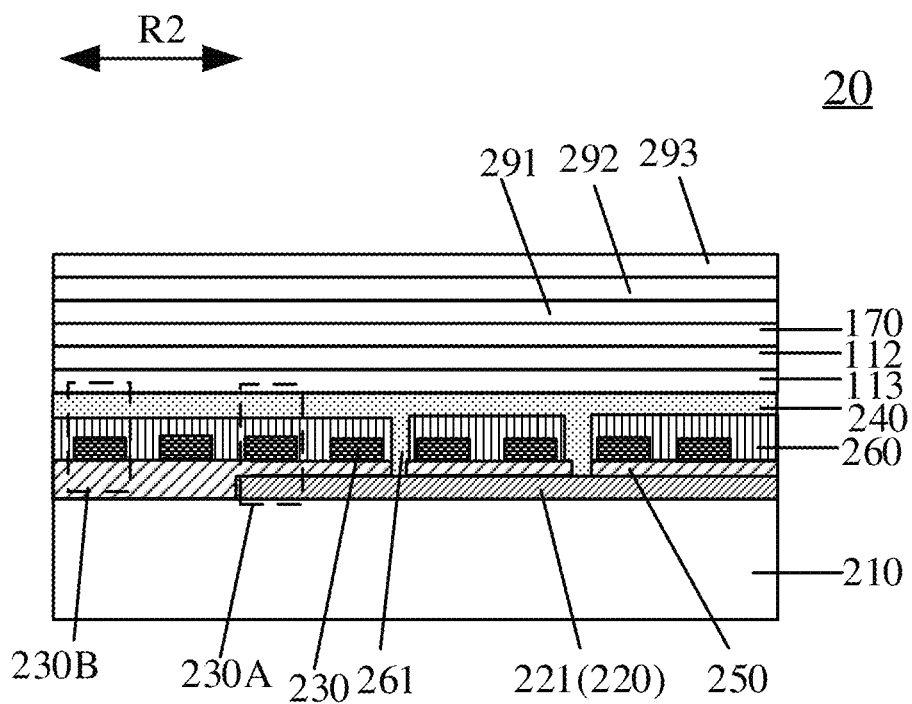
FIG. 5A is a cross-sectional view of the opening peripheral region of the display substrate taken along line A-A' as shown in FIG. 2A.

For example, in some embodiments, as shown in FIG. 3 and FIG. 5A, the opening peripheral region 203 further includes a semiconductor pattern 220 and a conductive pattern 240. The semiconductor pattern 220 and the conductive pattern 240 can be respectively spaced apart and insulated from the first wire 2301 and the second wire 2302 to form capacitors, thus forming compensation units having a capacitor structure to provide load compensation for the first wire 2301 and the second wire 2302.

For example, as shown in FIG. 3 and FIG. 5A, the semiconductor pattern 220 is located on the base substrate 210, the first wire 2301 and the second wire 2302 are located on a side of the semiconductor pattern 220 away from the base substrate 210, and the conductive pattern 240 is located on a side of the first wire 2301 and the second wire 2302 away from the semiconductor pattern 220. In a direction perpendicular to the base substrate 210, the first wire 2301 is spaced apart and insulated from at least one of the semiconductor pattern 220 and the conductive pattern 240 to be capable of forming a capacitor, and the second wire 2302 is spaced apart and insulated from at least one of the semiconductor pattern 220 and the conductive pattern 240 to be capable of forming a capacitor.

For example, in some embodiment, the first wire 2301 can be spaced apart and insulated from both the semiconductor pattern 220 and the conductive pattern 240 to form a capacitor, or, the first wire 2301 can be spaced apart and insulated from one of the semiconductor pattern 220 and the conductive pattern 240 to form a capacitor, or, a part of the first wire 2301 can be spaced apart and insulated from one of the semiconductor pattern 220 and the conductive pattern 240 to form a capacitor, while another part of the first wire 2301 can be spaced apart and insulated from both the semiconductor pattern 220 and the conductive pattern 240 to form a capacitor. Similarly, in some embodiment, the second wire 2302 can be spaced apart and insulated from both the semiconductor pattern 220 and the conductive pattern 240 to form a capacitor, or, the second wire 2302 can be spaced apart and insulated from one of the semiconductor pattern 220 and the conductive pattern 240 to form a capacitor, or, a part of the second wire 2302 can be spaced apart and insulated from one of the semiconductor pattern 220 and the conductive pattern 240 to form a capacitor, while another part of the second wire 2302 can be spaced apart and insulated from both the semiconductor pattern 220 and the conductive pattern 240 to form a capacitor. Thus, the first wire 2301 and the second wire 2302 can perform load compensation by forming different forms of capacitor structures with the semiconductor pattern 220 and the conductive pattern 240.

For example, in some embodiments, in the direction perpendicular to the base substrate 210, the first bent portion 2311 of the first wire 2301 is spaced apart and insulated from at least one of the semiconductor pattern 220 and the conductive pattern 240 to be capable of forming a capacitor. For example, the first bent portion 2311 of the first wire 2301 can be spaced apart and insulated from both the semiconductor pattern 220 and the conductive pattern 240 to form a capacitor, or, the first bent portion 2311 of the first wire 2301 can be spaced apart and insulated from one of the semiconductor pattern 220 and the conductive pattern 240 to form a capacitor, or a part of the first bent portion 2311 of the first wire 2301 can be spaced apart and insulated from one of the semiconductor pattern 220 and the conductive pattern 240 to form a capacitor, while another part of the first bent portion 2311 of the first wire 2301 can be spaced apart and insulated from both the semiconductor pattern 220 and the conductive pattern 240 to form a capacitor. Therefore, the first wire 2301 can make full use of the compensation space increased by the first bent portion 2311, so as to achieve sufficient compensation for loads of the first wire 2301.

For example, in the direction perpendicular to the base substrate 210, the second bent portion 2312 of the second wire 2302 is spaced apart and insulated from at least one of the semiconductor pattern 220 and the conductive pattern 240 to be capable of forming a capacitor. For example, the second bent portion 2312 of the second wire 2302 can be spaced apart and insulated from both the semiconductor pattern 220 and the conductive pattern 240 to form a capacitor, or, the second bent portion 2312 of the second wire 2302 can be spaced apart and insulated from one of the semiconductor pattern 220 and the conductive pattern 240 to form a capacitor, or a part of the second bent portion 2312 of the second wire 2302 can be spaced apart and insulated from one of the semiconductor pattern 220 and the conductive pattern 240 to form a capacitor, while another part of the second bent portion 2312 of the second wire 2302 can be spaced apart and insulated from both the semiconductor pattern 220 and the conductive pattern 240 to form a capacitor. Therefore, the second wire 2302 can make full use of the compensation space increased by the second bent portion 2312, so as to achieve sufficient compensation for loads of the second wire 2302.

It can be seen that the first bent portion 2311 and the second bent portion 2312 in the bent arrangement manner can respectively provide more load compensation space for the first wire 2301 and the second wire 2302, so that sufficient load compensation can be provided for the first wire 2301 and the second wire 2302 in a smaller arrangement space.

For example, in some embodiments, as shown in FIG. 3, the semiconductor pattern 220 includes a plurality of semiconductor lines 221 extending along the second direction R2, the second direction R2 is intersected with the first direction R1, and for example, the second direction R2 is perpendicular to the first direction R1. The conductive pattern 240 can also include a plurality of conductive lines extending along the second direction R2, so that the overlapping part of between the wire 230 and the conductive line forms a capacitor. Or, in some embodiments, as shown in FIG. 3, the conductive pattern 220 can also be continuously arranged on a side of at least one wire 230 away from the semiconductor pattern 220, that is, the conductive pattern 220 is arranged on the side of the at least one line 230 away from the semiconductor pattern 220 in the form of an entire block rather than separated wires, so that the overlapping area between the conductive pattern 220 and the wire 230 can be increased, and then the capacitance of the capacitor formed by the conductive pattern 240 and the wire 230 can be increased.

For example, in some embodiments, the line width of the wire 230 can be in the range of about 3 micrometers to 5 micrometers, and for example, 4 micrometers, etc.; and the line width of the semiconductor line 221 can be in the range of about 20 micrometers to 30 micrometers, and for example, 25 micrometers, etc.

For example, the "about" in the embodiments of the present disclosure means within the range of 5% above or below the numerical value.

For example, as shown in FIG. 3 and FIG. 5A, in some embodiments, in the direction perpendicular to the base substrate 210, a part where the wire 230 overlaps with both the semiconductor line 221 and the conductive pattern 240 forms a first compensation unit 230A, and a part where the wire 230 does not overlap with the semiconductor pattern 220 but overlaps only with the conductive pattern 240 forms a second compensation unit 230B. Therefore, the arrangement and combination of the two different compensation units can make the load compensation effect of each wire 230 more diversified, thereby making the compensation effect more accurate, and further improving the consistency of the loads of the wires 230.

Figure 5B:
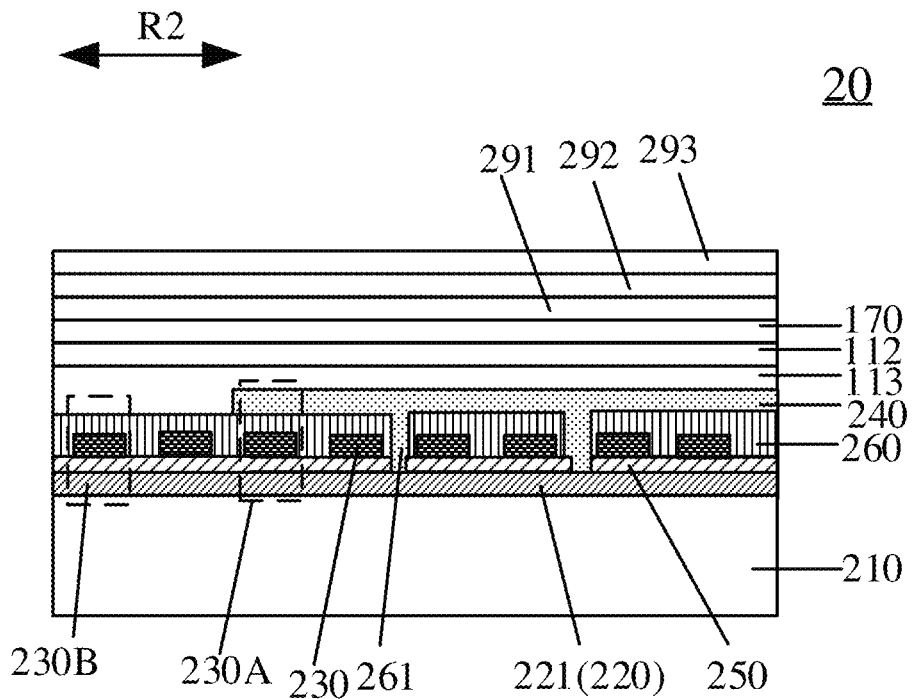
FIG. 5B is another cross-sectional view of the opening peripheral region of the display substrate taken along line A-A' as shown in FIG. 2A.

For example, in some other embodiments, as shown in FIG. 5B, in the direction perpendicular to the base substrate 210, a second part 232 of the wire 230 does not overlap with the conductive pattern 240, so that the second part 232 is only spaced apart and insulated from the semiconductor pattern 220 to provide a second capacitor structure, i.e., the second compensation unit 230B. In this case, in the manufacturing process of the display substrate, the conductive pattern 240 located on the second part 232 of the wire 230 is etched, while the conductive pattern 240 located on the first part 231 of the wire 230 is retained, so that the second part 232 is only spaced apart and insulated from the semiconductor pattern 220 to provide the second capacitor structure, i.e., the second compensation unit 230B, while the first part 231 is spaced apart and insulated from both the semiconductor pattern 220 and the conductive pattern 240 to provide a first capacitor structure, i.e, the first compensation unit 230A. For example, the etched position of the conductive pattern 240 is filled with an insulating material.

For example, in the embodiments of the present disclosure, two structures being spaced apart and insulated from each other can mean that a space is set between the two structures so as to insulate the two structures. For example, an insulating material can be provided between the two structures. For example, in some embodiments, in the direction perpendicular to the display substrate, at least a part of the wire 230 has an overlapped portion with the semiconductor pattern 220, and an insulating layer is provided between the at least a part of the wire 230 and the semiconductor pattern 220, so as to form a capacitor structure; and at least a part of the wire 230 has an overlapped portion with the conducive pattern 240, and an insulating layer is provided between the at least a part of the wire 230 and the conducive pattern 240, so as to form a capacitor structure.

It should be noted that, in the embodiments of the present disclosure, one first compensation unit 230A is defined by the overlapping part between the wire 230 and the semiconductor line 221 under the condition that the wire 230 and the semiconductor line 221 are spaced apart from each other. In this case, the gap between adjacent semiconductor lines 221 defines the gap between adjacent first compensation units 230A. Similarly, one second compensation unit 230B and the gap between adjacent second compensation units 230B are defined with reference to the area of the overlapping part between the wire 230 and the semiconductor line 221 under the condition that the wire 230 and the semiconductor line 221 and the gap between adjacent first compensation units 230A. In this case, the conductive pattern 240 is continuously arranged, so that in each compensation unit, the compensation effect of the capacitor formed by the wire 230 and the conductive pattern 240 is also superimposed with the compensation effect of the capacitor formed by the conductive pattern 240 and the wire 230 located in the gap between adjacent compensation units. In this case, the difference between the compensation effect of the first compensation unit 230A and the compensation effect of the second compensation unit 230B is the compensation effect brought by the capacitor formed by the wire 230 and the semiconductor line 221 in each first compensation unit 230A. In addition, in some other embodiments of the present disclosure, the first compensation unit 230A and the second compensation unit 230B can also be divided in other ways, as long as different compensation units with different compensation effects can be formed.

For example, in some embodiments, the number of sub-pixels included in the first row of sub-pixels is the same as the number of sub-pixels included in the second row of sub-pixels. In this case, the load of the first wire 2301 and the load of the second wire 2302 are basically the same, so that the number of the first compensation units 230A included in the first wire 2301 can be the same as the number of the first compensation units 230A included in the second wire 2302, and the number of the second compensation units 230B included in the first wire 2301 can be the same as the number of the second compensation units 230B included in the second wire 2302. Therefore, basically the same load compensation is provided for the first wire 2301 and the second wire 2302, so that the load of the first wire 2301 and the load of the second wire 2302 remain basically the same, and ideal loads are achieved.

For example, in some other embodiments, the number of sub-pixels included in the first row of sub-pixels is different from the number of sub-pixels included in the second row of sub-pixels. In this case, the number of first compensation units 230A included in the first wire 2301 is different from the number of first compensation units 230A included in the second wire 2302, or the number of second compensation units 230B included in the first wire 2301 is different from the number of second compensation units 230B included in the second wire 2302, or the number of first compensation units 230A included in the first wire 2301 and the number of second compensation units 230B included in the first wire 2301 are respectively different from the number of first compensation units 230A included in the second wire 2302 and the second compensation units 230B included in the second wire 2302. Therefore, by providing different compensation units for the first wire 2301 and the second wire 2302, basically the same load compensation can be provided for the first wire 2301 and the second wire 2302, so that the load of the first wire 2301 and the load of the second wire 2302 are basically the same, and ideal loads are achieved.

Figure 2C:
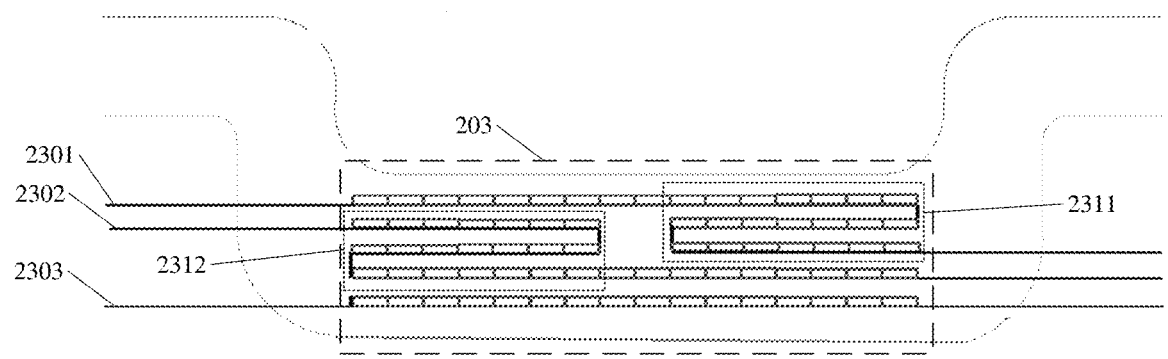
FIG. 2C is another partial enlarged view of the display substrate in FIG. 2A.

For example, in some embodiments, as shown in FIG. 2C, in the display substrate 20, the plurality of wires 230 further include a third wire 2303 which is arranged on the same layer as the first wire 2301 and the second wire 2302. The third wire 2303 passes through the first display region 2011, the opening peripheral region 203 and the second display region 2012, sequentially. The third wire 2303 extends along the first direction R1, for example, extends basically linearly in the opening peripheral region 203, and the third wire 2303 is configured to provide a scan signal for a third row of sub-pixels arranged along the first direction R1 in the first display region 2011 and the second display region 2012.

For example, the third wire 2303 is spaced apart and insulated from at least one of the semiconductor pattern 220 and the conductive pattern 240 to be capable of forming a capacitor. For example, the third wire 2303 can be spaced apart and insulated from both the semiconductor pattern 220 and the conductive pattern 240 to form a capacitor, or, the third wire 2303 is spaced apart and insulated from one of the semiconductor pattern 220 and the conductive pattern 240 to form a capacitor, or, a part of the third wire 2303 is spaced apart and insulated from one of the semiconductor pattern 220 and the conductive pattern 240 to form a capacitor, while another part of the third wire 2303 is spaced apart and insulated from both the semiconductor pattern 220 and the conductive pattern 240 to form a capacitor. Thus, the third wire 2303 can perform load compensation by forming different forms of capacitor structures with the semiconductor pattern 220 and the conductive pattern 240.

For example, in some embodiments, the number of sub-pixels included in the third row of sub-pixels is greater than the number of sub-pixels included in the first row of sub-pixels; or, the number of sub-pixels included in the third row of sub-pixels is greater than the number of sub-pixels included in the second row of sub-pixels; or, the number of sub-pixels included in the third row of sub-pixels is greater than the number of sub-pixels included in the first row of sub-pixels, and also greater than the number of sub-pixels included in the second row of sub-pixels. Because the number of sub-pixels included in the third row of sub-pixels is greater relative to the number of sub-pixels included in the first row of sub-pixels and the number of sub-pixels included in the second row of sub-pixels, the third wire 2303 requires less load compensation, and in this case, the third wire 2303 can be fully compensated by using fewer capacitor structures. Therefore, the third wire 2303 can pass through the opening peripheral region 203 in a basically linear shape and does not have a bent portion in the opening peripheral region 203.

For example, in some embodiments, as shown in FIG. 2A, the display region 201 further includes a third display region 2013. The two opposite edges 2013A and 2013B, extending along the second direction R2 perpendicular to the first direction R1, of the third display region 2013, are respectively aligned with the edge 2011A, extending along the second direction R2 and away from the opening 201A, of the first display region 2011, and the edge 2012A, extending along the second direction R2 and away from the opening 201A, of the second display region 2012. The third display region 2013 includes a plurality of sub-pixels arranged in multiple rows and multiple columns, and further includes a plurality of fourth wires 2304 (one fourth wire 2304 is shown as an example in the figure) extending along the first direction R1, and each of the plurality of fourth wires 2304 is configured to provide an electrical signal (e.g., a scan signal) for each row of sub-pixels among the multiple rows and multiple columns of sub-pixels. As shown in FIG. 2A, the first display region 2011, the opening 201A, the second display region 2012, and the third display region 2013, as a whole, forms a rectangular region. For example, in some other embodiments, the first display region 2011, the opening 201A, the second display region 2012, and the third display region 2013, as a whole, may also be in any other shape, and for example, a regular shape, such as a circle, a square, etc., or an irregular shape, without being specifically limited in the embodiments of the present disclosure.

For example, in some embodiments, the number of sub-pixels included in each row of sub-pixels among the multiple rows and multiple columns of sub-pixels is basically the same. In this case, the numbers of sub-pixels electrically connected to the plurality of fourth wires 2304 are basically the same, so that the plurality of fourth wires 2304 have basically the same loads. For example, the number of sub-pixels included in each row of sub-pixel among the multiple rows and multiple columns of sub-pixels is greater than the number of sub-pixels included in the first row of sub-pixels, greater than the number of sub-pixels included in the second row of sub-pixels, and greater than the number of sub-pixels included in the third row of sub-pixels. For example, the load of each wire 230 after load compensation is basically the same as the load of each of the plurality of fourth wires 2304, and then the transmission speeds of each wire 230 and each fourth wire 2304 are basically the same, so that the display consistency of the display region 201 can be maintained, and the display effect of the display substrate 20 can be improved.

For example, in the design process of the display substrate 20, the loads of the plurality of wires 230 can be designed by taking the load of the fourth wire 2304 as a benchmark load, so that the load of every signal line that provides a scan signal for the display region 201 are the same. For example, a certain number of first compensation units 230A and a certain number of second compensation units 230B are provided for each wire 230, so that the load of each wire 230 is basically the same as the load of each of plurality of fourth wires 2304. For example, in the case where the number of sub-pixels electrically connected to the first wire 2301 and the number of sub-pixels electrically connected to the second wire 2302 are different, the first wire 2301 and the second wire 2302 are provided with different numbers of the first compensation unit 230A and the second compensation unit 230B, so that the load of the first wire 2301, the load of the second wire 2302 and the load of the fourth wire 2304 are basically the same.

Figure 4:
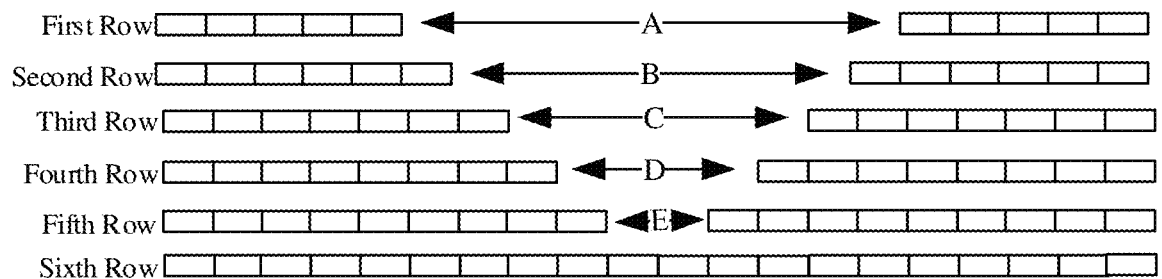
FIG. 4 is a planar view of sub-pixel arrangement at the periphery of an opening peripheral region of a display substrate provided by at least one embodiment of the present disclosure.

For example, FIG. 4 shows six rows of sub-pixels at the periphery of the opening peripheral region. For example, in some examples, as shown in FIG. 4, assuming that the sixth row of sub-pixels are a full row of sub-pixels and the total load of the sixth row of sub-pixels is M, the first to fifth rows of sub-pixels are sub-pixels located at both sides of the opening, the first to fifth rows of sub-pixels are not full, and the number of sub-pixels gradually increases from the first row to the fifth row. In this case, compensation units are provided for the first to fifth rows of sub-pixels, so that the load of each row of sub-pixels is closer to or basically equal to M. For example, the total capacitance of the compensation units provided for the sub-pixels in the first row to the fifth row is gradually reduced.

For example, in some examples, due to the limited space for providing compensation units, for example, the lengths of the compensation space from the first row to the fifth row are A, B, C, D and E, respectively; after compensation, the total load of each row among the first to fifth rows of sub-pixels is still difficult to reach M. In this case, the total loads of the first to fifth rows of sub-pixels may be gradually increased, that is, a compensation solution with gradual load change is adopted.

For example, after compensation, the total loads of the first to fifth rows of sub-pixels are V/100×M, U/100×M, T/100×M, S/100×M and R/100×M, respectively, where R>S>T>U>V, R≤100, and R, S, T, U, and V are respectively the percent occupied by loads of the first to fifth rows of sub-pixels in the case where M is 100 percent.

Taking the fifth row of sub-pixels as an example, in a space with a length of E, the total load of the fifth row of sub-pixels can reach R/100×M by arranging X first compensation units and Y second compensation units. Assuming that the total capacitance of a first compensation unit is P and the total capacitance of a second compensation unit is Q, X×P+Y×Q+ the total load of the fifth row before compensation (that is, the total load of the sub-pixels on the left and right sides of the space E)=R/100×M.

As can be seen from the capacitance formula C=ε*S/d, the magnitude of the capacitance of a capacitor depends on the opposing area and distance between two capacitor substrates in the capacitor. Therefore, by designing the width of the wire 230, the width of the semiconductor line 221, the distance between the wire 230 and the semiconductor line 221 and the distance between the wire 230 and the conductive pattern 240, the total capacitance P of the first compensation unit and the total capacitance Q of the second compensation unit being required can be obtained.

In some examples, due to process needs or other needs, the total load of the fifth row of sub-pixels need to be R1/100×M, and in this case, the manufacturing process of the semiconductor pattern 220 or the manufacturing process of the conductive pattern 240 may only be changed. For example, the mask used for manufacturing the semiconductor pattern 220 or the conductive pattern 240 is changed, so as to change an original first compensation unit into a second compensation unit, or to change an original second compensation unit into a first compensation unit, thereby changing the compensation amount provided for the fifth row of sub-pixels and changing the total load of the fifth row of sub-pixels to R1/100×M. Assuming that after the change, the number of the first compensation unit is X1 and the number of the second compensation unit is Y1, X1×P+Y1×Q+ the total load of the fifth row before compensation (that is, the total load of the sub-pixels on the left and right sides of the space E)=R/100×M. If in the process of changing the compensation unit, W first compensation units are replaced with the second compensation units, then, Y1=Y+W, X1=X−W; and if in the process of changing the compensation unit, H second compensation units are replaced with the first compensation units, then, Y1=Y−H, X1=X+H.

Therefore, in the manufacturing process of the display substrate provided by the embodiments of the present disclosure, by changing the manufacturing process of a functional layer, for example, changing the mask used for manufacturing the semiconductor pattern 220 or the conductive pattern 240, the compensation amount provided for a row of sub-pixels can by changed, and the required compensation amount can be obtained by designing the size and number of the first compensation units and the size and number of the second compensation units.

For example, in some embodiments, as shown in FIG. 5A, the display substrate 20 further includes a first insulating layer 250 and a second insulating layer 260. The first insulating layer 250 is located on a side of the semiconductor pattern 220 away from the base substrate 210, the first wire 2301 and the second wire 2302 are located on a side of the first insulating layer 250 away from the semiconductor pattern 220, the second insulating layer 260 is located on a side of the first wire 2301 and the second wire 2302 away from the first insulating layer 250, and the conductive pattern 240 is located on a side of the second insulating layer 260 away from the first wire 2301 and the second wire 2302. Thus, the semiconductor pattern 220 is spaced apart and insulated from the wire 230 by the first insulating layer, and the wire 230 is spaced apart and insulated from the conductive pattern 240 by the second insulating layer 260, so as to form compensation units having different capacitor structures.

For example, via holes are provided in the first insulating layer 250 and the second insulating layer 260, and the semiconductor pattern 220 is electrically connected to the conductive pattern 240 through the via holes 261 in the first insulating layer 250 and the second insulating layer 260. Thus, the semiconductor pattern 220 and the conductive pattern 240 can have the same electrical level.

Figure 5C:
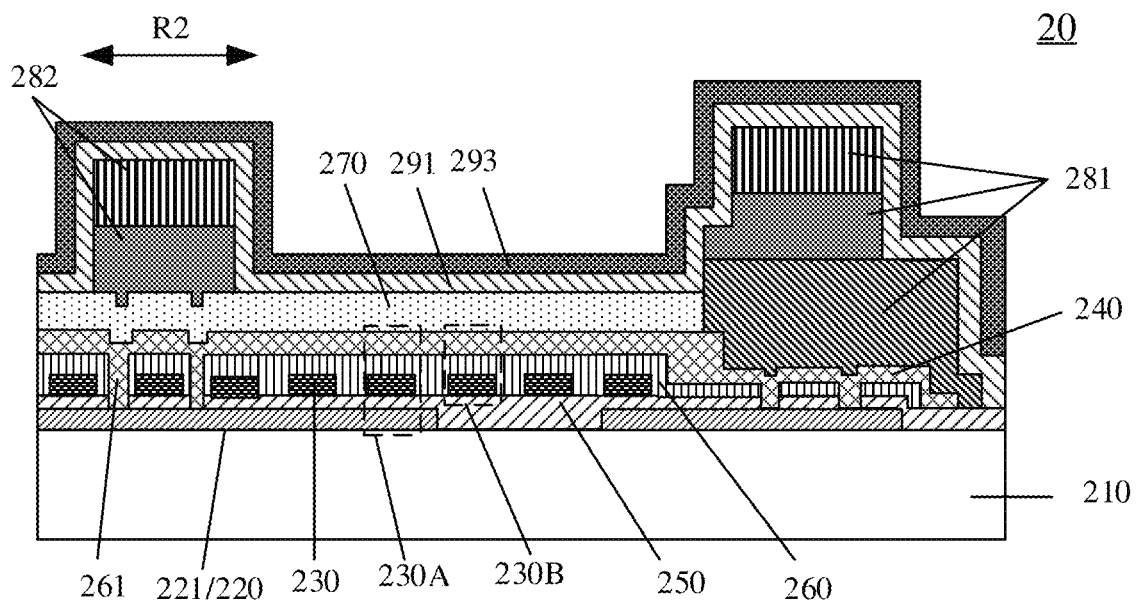
FIG. 5C is another cross-sectional view of the opening peripheral region of the display substrate taken along line A-A' as shown in FIG. 2A.

For example, in some embodiments, as shown in FIG. 5C, the display substrate 20 can further include a first barrier wall 281 and a second barrier wall 282 respectively located at both sides of the opening peripheral region 203. For example, in the second direction perpendicular to the base substrate 210, i.e., in the vertical direction in the figure, the plurality of via holes 261 overlap with the first barrier wall 281 and/or the second barrier wall 282. In this case, a part of the semiconductor pattern 220 located between the first barrier wall 281 and the second barrier wall 282 can be etched, so that the second part of the wire 230 is only spaced apart and insulated from the conductive pattern 240 at the position where the semiconductor pattern 220 is etched, thus forming the second compensation unit 230B having a second capacitor structure. For example, in FIG. 5C, the plurality of via holes 261 are only provided below the first barrier wall 281 and/or the second barrier wall 282. In this case, no via hole 261 is provided at the position between the first barrier wall 281 and the second barrier wall 282, thus eliminating or alleviating the undulation phenomenon which may occur to the surface of the conductive pattern 240 between the first barrier wall 281 and the second barrier wall 282 due to the existence of the via holes and therefore, the film surface of the conductive pattern 240 is kept even and flat. Furthermore, the surfaces of various insulating layers and various encapsulation layers covering the conductive pattern 240 can be kept even and flat, thereby avoiding or reducing crack phenomenon which may occur to the surface of the encapsulation layer, further improving the uniformity and consistency of the encapsulation layer, and further improving the encapsulation effect of the encapsulation layer on the display substrate.

For example, in some other embodiments, the semiconductor pattern 220 and the conductive pattern 240 may not be electrically connected through via holes, but are arranged separately, so that the semiconductor pattern 220 and the conductive pattern 240 can have different electrical levels.

For example, in some embodiments, the display substrate 10 further includes a power line pattern 270 electrically connected to the conductive pattern 240. The power line pattern 270 is configured to provide an electrical signal for the conductive pattern 240, and the electrical signal can be a fixed electrical signal in any form, rather than a pulse signal.

For example, in some embodiments, functional structures in the opening peripheral region 203, such as the semiconductor pattern 220, at least one wire 230 and the conductive pattern 240, etc., can be arranged on the same layer as some functional structures in the display region 201, so as to reduce the manufacture of the display substrate.

In some embodiments, as shown in FIG. 5A and FIG. 5B, an insulating layer 113, a first planarization layer 112, a pixel defining layer 170, a first inorganic encapsulation layer 291, an organic encapsulation layer 292 and a second inorganic encapsulation layer 293 are arranged at one side of the conductive pattern 240 away from the base substrate 210. For example, these functional layers all extend from the display region, so as to be arranged on the same layer as and integrally connected with the corresponding functional layers in the display region.

Figure 5D:
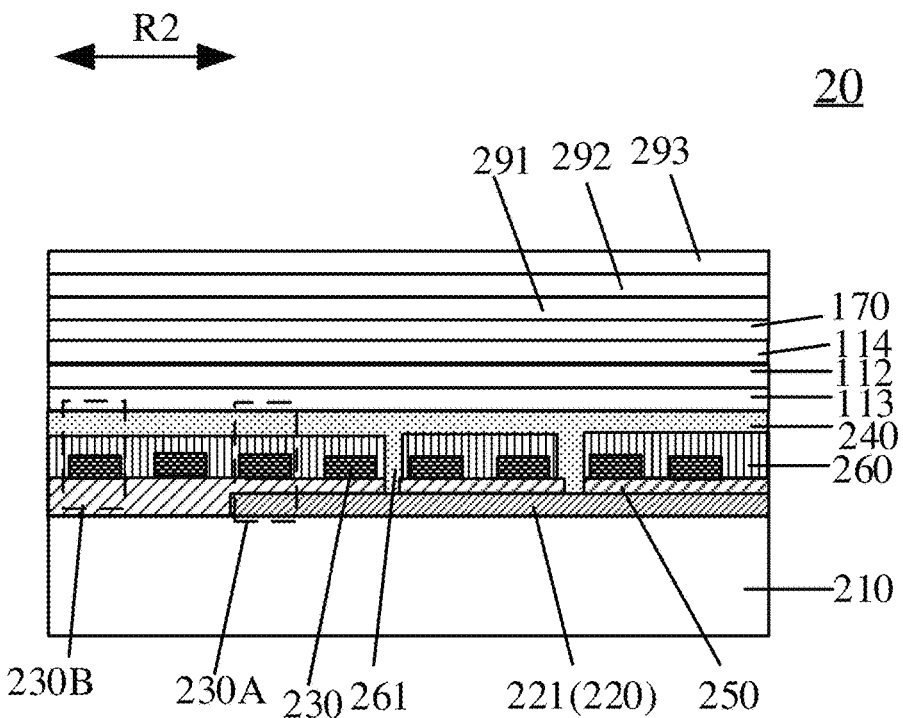
FIG. 5D is another cross-sectional view of the opening peripheral region of the display substrate taken along line A-A' as shown in FIG. 2A.
Figure 5E:
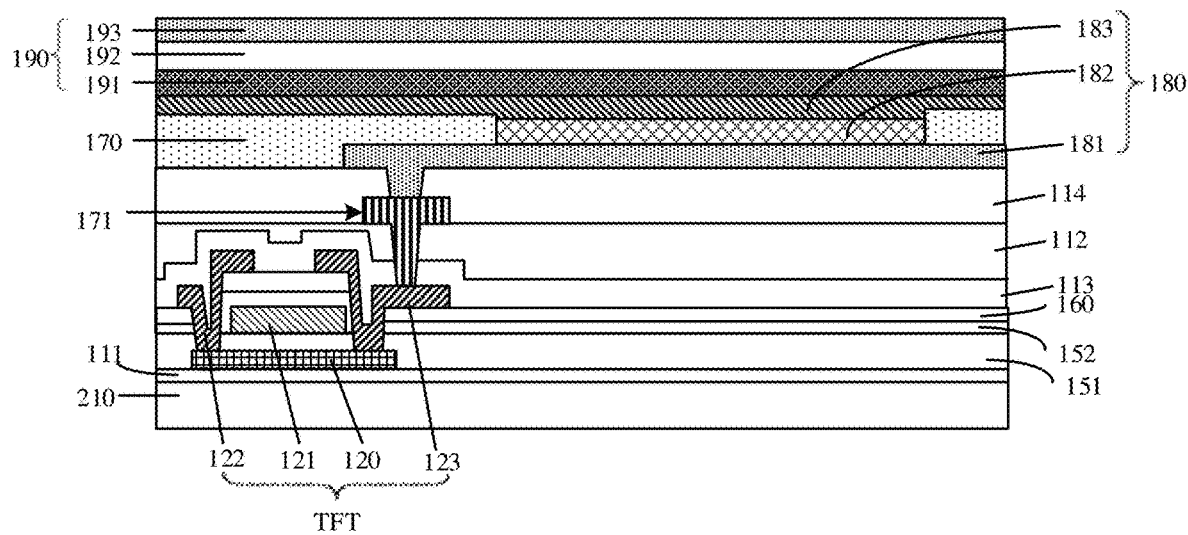
FIG. 5E is a cross-sectional view of the display region of the display substrate taken along line A-A' as shown in FIG. 2A.

For example, in some other embodiments, as shown in FIG. 5D, an insulating layer 113, a first planarization layer 113, a second planarization layer 114, a pixel defining layer 170, a first inorganic encapsulation layer 291, an organic encapsulation layer 292 and a second inorganic encapsulation layer 293 are arranged at one side of the conductive pattern 240 away from the base substrate 210. Compared with the above-mentioned embodiment, the peripheral region 203 in FIG. 5D has an additional second planarization layer 114. In this case, a partial cross-sectional view of the display region is shown in FIG. 5E. Different from the display region shown in FIG. 6, in the display region shown in FIG. 5E, an anode 181 of a light emitting element 180 is electrically connected to a drain electrode 123 of a thin film transistor TFT through a via electrode 171. In this case, the via electrode 171 is covered by the second planarization layer 114, and the second planarization layer 114 extends into the opening peripheral region 203, thereby forming the structure as shown in FIG. 5D.

For example, in some other embodiments, the display region of the display substrate may not have the insulating layer 113 and the second planarization layer 114.

It should be noted that in the embodiments of the present disclosure, "being arranged on a same layer" means that two functional layers or structural layers are formed on the same layer and formed of the same material among the hierarchical structure of the display substrate. That is, in the manufacturing process, the two functional layers or structural layers can be formed by using a same material layer, and the required pattern and structure can be formed by the same patterning process. For example, after a material layer is firstly formed, the two functional layers or structural layers can be formed by a patterning process using the material layer.

For example, the display substrate 20 may be a display substrate of various types, such as an organic light emitting diode (OLED) display substrate, a quantum dot light emitting diode (QLED) display substrate, or a liquid crystal display substrate, etc. For example, taking an organic light emitting diode display substrate as an example, the display region of the display substrate 201 includes a plurality of sub-pixels arranged in an array, and each sub-pixel includes a light emitting element (an organic light emitting diode) and a pixel circuit that provides a driving signal for the light emitting element.

Figure 6:
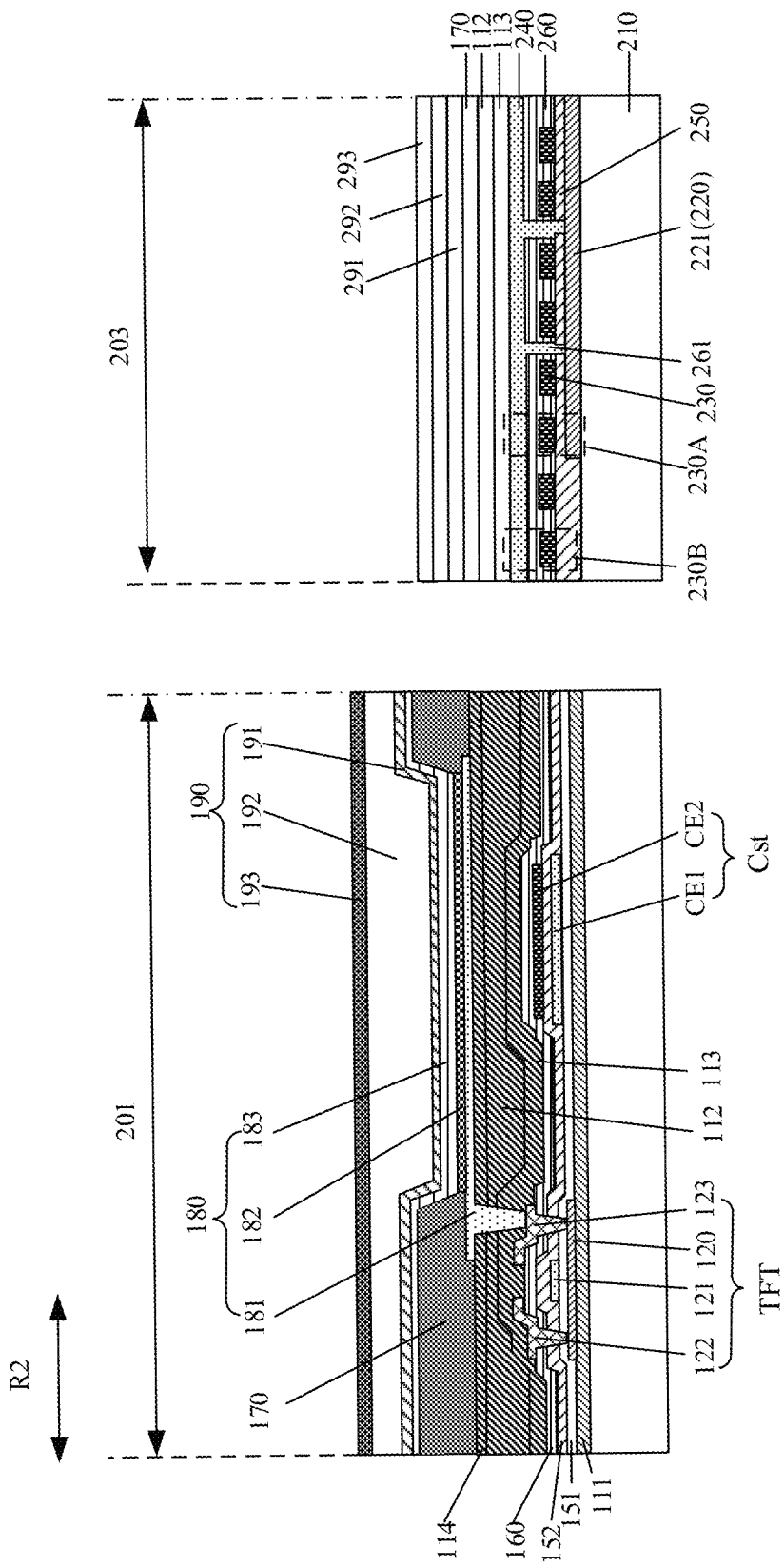
FIG. 6 is a cross-sectional view of the display region and the opening peripheral region of the display substrate taken along line A-A' as shown in FIG. 2A.

For example, as shown in FIG. 6, each sub-pixel in the display region 201 of the display substrate 20 includes a pixel circuit, and the pixel circuit includes a thin film transistor TFT and a storage capacitor Cst. The thin film transistor TFT includes an active layer 120, a gate electrode 121, and source-drain electrodes 122/123. The storage capacitor Cst includes a first capacitor plate CE1 and a second capacitor plate CE2. For example, the semiconductor pattern 220 can be arranged on a same layer as the active layer 120, the gate electrode 121 can be arranged on a same layer as the first capacitor plate CE1, the at least one wire 230 can be arranged on a same layer as the second capacitor plate CE2, and the conductive pattern 240 can be arranged on a same layer as the source-drain electrodes 122/123. Therefore, the manufacturing process of the display substrate 20 can be simplified.

For example, in some other embodiments, the conductive pattern may also be arranged on a same layer as the gate electrode and the first capacitor electrode; or, a part of the conductive pattern may be arranged on a same layer as the second capacitor plate, and the other part of the conductive pattern may be arranged on a same layer as the gate electrode and the first capacitor plate, that is, the conductive pattern includes two parts alternately formed. The specific form of the conductive pattern is not limited in the embodiments of the present disclosure.

For example, as shown in FIG. 6, the display region 201 further includes a first gate insulating layer 151 between the active layer 120 and the gate electrode 121, and a second gate insulating layer 152 and an interlayer insulating layer 160 arranged on the gate electrode 121. The second gate insulating layer 152 is located between the first capacitor plate CE1 and the second capacitor plate CE2, so that the first capacitor plate CE1, the second gate insulating layer 152 and the second capacitor plate CE2 form a storage capacitor Cst. The interlayer insulating layer 160 covers the second capacitor plate CE2. For example, the first insulating layer 250 in the opening peripheral region 203 is arranged on a same layer as the first gate insulating layer 151 and the second gate insulating layer 152 in the display region 201, and the second insulating layer 260 in the opening peripheral region 203 is arranged on a same layer as the interlayer insulating layer 160 in the display region. Therefore, the manufacturing process of the display substrate 20 can be simplified.

For example, in some embodiments, as shown in FIG. 6, each sub-pixel in the display region 201 of the display substrate 20 further includes a light emitting element 180. The light emitting element 180 includes a cathode 183, an anode 181, and a light emitting layer 182 between the cathode 183 and the anode 181. At least one of the cathode 183 and the anode 181 is electrically connected to the pixel circuit. For example, the power line pattern 270 in the opening peripheral region 203 can be arranged on a same layer as the cathode 183 in the display region 201. For example, in some examples, the cathode 183 is an entire surface structure arranged on the display substrate 20, and is a common electrode for the plurality of sub-pixels. In this case, the power line pattern 270 can be a portion of the cathode 183 extending to the opening peripheral region 203, that is, the power line pattern 270 and the cathode 183 is a continuous integrated structure. In this case, as shown in FIG. 5C, the power line pattern 270 at least partially covers one side of the conductive pattern 240 away from the base substrate 210 and is in contact with the conductive pattern 240, thereby achieving electrical connection as shown in FIG. 5C; or, in some examples, the power line pattern 270 is electrically connected to the conductive pattern 240 through a via hole. Therefore, the power line pattern 270 can transmit the same electrical signal as that on the cathode 183 to the conductive pattern 240.

For example, in some embodiments, the power line pattern 270 in the opening peripheral region 203 can be arranged on a same layer as the anode 181 in the display region 201, and the power line pattern 270 is insulated from the anode 181. The power line pattern 270 is connected to a VSS power line in the opening peripheral region by an overlap joint, the power line pattern 270 at least partially covers one side of the conductive pattern 240 away from the base substrate 210 and is in contact with the conductive pattern 240 to achieve electrical connection, so as to transmit the same electrical signal as that on the cathode 183 to the conductive pattern 240. In some embodiments, the power line pattern 270 is further connected to the cathode 183 by an overlap joint, so as to provide a VSS power signal to the cathode.

In some embodiments, the power line pattern 270 covers a part of the compensation structure (the first compensation structure and/or the second compensation structure). For example, a power line pattern 270 is arranged above the compensation structure at a position close to the first barrier wall 281 and the second barrier wall 282, and no power line pattern 270 is arranged above the compensation structure at a position close to the display region 201.

For example, in some other embodiments, the display region 201 further includes a first power line (which will be described in detail in the following) electrically connected to the pixel circuit, and the power line pattern 270 can be arranged on a same layer as the first power line. For example, the first power line is configured to provide a VDD power signal. For example, as shown in FIG. 3, the power line pattern 270, the first power line VDD and the conductive pattern 240 are arranged on the same layer and are integrally connected. For example, the first power line VDD can provide a power signal for the sub-pixels P in the third sub-display region 2013; or, in some examples, the power line pattern 270 serves as a connection electrode to electrically connect the first power line to the conductive pattern 240 through a via hole. The embodiments of the present disclosure do not limit the specific structure of the power line pattern 270, as long as the power line pattern 270 can realize the electrical connection between the first power line and the conductive pattern 240. Thus, the power line pattern 270 can transmit the same electrical signal as that on the first power line to the conductive pattern 240.

For example, in some embodiments, the display substrate 20 further includes other functional structures. For example, the opening peripheral region 203 of the display substrate 20 further includes a first barrier wall 281 and a second barrier wall 282. The first barrier wall 281 and the second barrier wall 282 can prevent a crack, which may be formed in the process of forming the opening, from extending to the display region 201, so as to protect the display region 201. For example, the display region 201 further includes a first planarization layer 112 and an insulating layer 113 (e.g., a passivation layer) covering the pixel circuit, as shown in FIG. 6. For example, in some other embodiments, as shown in FIG. 5E, the display region 201 can further include a via electrode 171 and a second planarization layer 114. As shown in FIG. 5E and FIG. 6, the display region 201 further includes a pixel defining layer 170 for defining a plurality of sub-pixels, and structures (not shown), such as spacers and the like, on the pixel defining layer 170. For example, the first barrier wall 281 and the second barrier wall 282 can include a multi-layer structure. For example, the first barrier wall 281 shown in FIG. 5C includes a three-layer structure, and in this case, the first barrier wall 281 can be arranged on the same layer as the planarization layer(s) 112/114, the pixel defining layer 170, and the spacers. The second barrier wall 282 shown in FIG. 5C includes a double-layer structure, and in this case, the second barrier wall 282 can be arranged on the same layer as any two selected from the group consisting of the planarization layer(s) 112/114, the pixel defining layer 170 and the spacers. Therefore, the manufacturing process of the display substrate can be simplified.

As shown in FIG. 5E, in some embodiments, the anode 181 is electrically connected to the drain electrode 123 through a via electrode, an insulating layer 113 (e.g., a passivation layer, formed of a martial, such as silicon oxide, silicon nitride, or silicon oxynitride, etc.) is further arranged on the source-drain electrodes, a first planarization layer 112 is arranged on the first insulating layer, a via electrode 171 is arranged on the first planarization layer 112, a second planarization layer 114 is arranged on the via electrode 171, and the via electrode 171 is electrically connected to the anode 181 through a via hole penetrating the second planarization layer 114 and is electrically connected to the drain electrode 123 through a via hole penetrating the first planarization layer 114 and the insulating layer 113.

For example, the opening peripheral region 203 of the display substrate 20 further includes encapsulation layers 291, 292 and 293. The display region 201 further includes an encapsulation layer 190, and the encapsulation layer 190 includes a plurality of encapsulation sub-layers 191/192/193. For example, the first encapsulation layer 291 is arranged on a same layer as the first encapsulation sub-layer 191 in the encapsulation layer 190, the second encapsulation layer 292 is arranged on a same layer as the second encapsulation sub-layer 192 in the encapsulation layer 190, and the third encapsulation layer 293 is arranged on a same layer as the third encapsulation sub-layer 193 in the encapsulation layer 190. For example, both the first encapsulation layer 291 and the third encapsulation layer 293 can include an inorganic encapsulation material, such as silicon oxide, silicon nitride, or silicon oxynitride, etc. The second encapsulation layer 292 can include an organic material, such as a resin material, etc. The multi-layer encapsulation structures in the display region 201 and the opening peripheral region 203 can achieve a better encapsulation effect, so as to prevent impurities, such as water vapor or oxygen, etc., from penetrating into the display substrate 20.

For example, in the embodiments of the present disclosure, the base substrate 210 can be a glass substrate, a quartz substrate, a metal substrate, a resin substrate, etc. For example, the material of the base substrate 210 can include an organic material. For example, the organic material can be a resin material, such as polyimide, polycarbonate, polyacrylate, polyetherimide, polyethersulfone, polyethylene terephthalate, and polyethylene naphthalate, etc. For example, the base substrate 210 can be a flexible substrate or a non-flexible substrate, without being limited in the embodiments of the present disclosure.

For example, the materials of the first gate insulating layer 151, the second gate insulating layer 152, the interlayer insulating layer 160, the planarization layer 112, the pixel defining layer 170 and the spacers, can include an inorganic insulating material, such as silicon oxide, silicon nitride, silicon oxynitride, etc., or can include an organic insulating material, such as polyimide, polyphthalimide, polyphthalamide, acrylic resin, benzocyclobutene, or phenol resin, etc. The embodiments of the present disclosure do not specifically limit the materials of the first gate insulating layer 151, the second gate insulating layer 152, the interlayer insulating layer 160, the planarization layer 112, the pixel defining layer 170 and the spacers. For example, the materials of the first gate insulating layer 151, the second gate insulating layer 152, the interlayer insulating layer 160, the planarization layer 112, the pixel defining layer 170 and the spacers can be the same or partially the same, or can be different from each other, without being limited in the embodiments of the present disclosure.

For example, the materials of the semiconductor pattern 220 and the active layer 120 can include a semiconductor material, such as poly-silicon or oxide semiconductor (e.g., indium gallium zinc oxide). For example, the semiconductor pattern 220 and a part of the active layer 120 can be conductive by a conductive process, such as doping, etc., so as to have higher conductivity. In this case, the semiconductor pattern 220 is a conductive semiconductor pattern.

For example, the materials of the second capacitor plate CE2 and the at least one wire 230 can include a metal material or an alloy material, such as molybdenum, aluminum, titanium, etc. The materials of the gate electrode 121 and the first capacitor plate CE1 can also include a metal material or an alloy material, such as molybdenum, aluminum, titanium, etc.

For example, the materials of the source-drain electrodes 133/123 and the materials of the conductive pattern 240 can include a metal material or an alloy material, such as a metal single-layer or multi-layer structure formed of molybdenum, aluminum, titanium, etc. For example, the multi-layer structure is a multi-metal layer stack, such as a three-layer metal stack (Al/Ti/Al) formed of titanium, aluminum, titanium, and the like.

For example, the material of the anode 181 can include at least one conductive oxide material, such as indium tin oxide (ITO), indium zinc oxide (IZO), zinc oxide (ZnO), etc., or can further include a metal with high reflectivity as a reflecting layer, such as silver (Ag). The material of the cathode 183 can include a metal material, such as lithium (Li), aluminum (Al), magnesium (Mg), silver (Ag), etc.

For example, in the case where the display substrate 20 is an organic light emitting diode (OLED) display substrate, the light emitting layer 182 can include a small-molecule organic material or a polymer organic material, which can be a fluorescent light emitting material or a phosphorescent light emitting material and can emit red light, green light, blue light, or white light, etc. Moreover, according to actual different needs, in different examples, the light emitting layer 182 can further include a functional layer, such as an electron injection layer, an electron transport layer, a hole injection layer, a hole transport layer, etc.

For example, in the case where the display substrate 20 is a quantum dot light emitting diode (QLED) display substrate, the light emitting layer 182 can include a quantum dot material, such as silicon quantum dot, germanium quantum dot, cadmium sulfide quantum dot, cadmium selenide quantum dot, cadmium telluride quantum dot, zinc selenide quantum dot, lead sulfide quantum dot, lead selenide quantum dot, indium phosphide quantum dot and indium arsenide quantum dot, etc. The particle size of the quantum dot is in the range of 2-20 nm.

Figure 7:
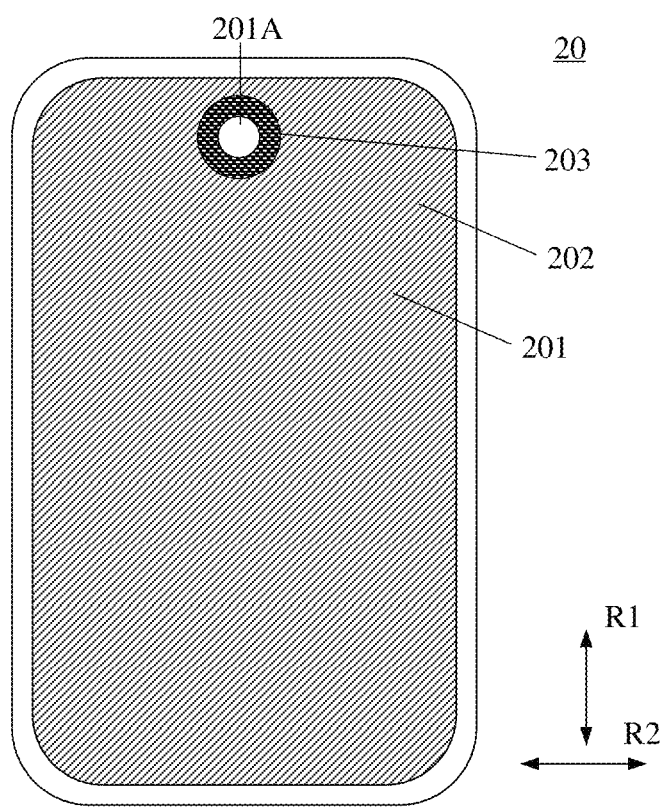
FIG. 7 is a planar view of another display substrate provided by at least one embodiment of the present disclosure.

For example, in some other embodiments of the present disclosure, as shown in FIG. 7, the opening 201A in the display substrate 20 can also have any other shape, such as a circle (as shown in the figure), a drop-let shape, a triangle, etc. In this case, the arrangement of the display region 201, the peripheral region 202 and the opening peripheral region 203 is as shown in FIG. 7. The embodiments of the present disclosure do not limit the specific shape of the opening 201A.

At least one embodiment of the present disclosure provides a display apparatus, and the display apparatus includes any one of the display substrates described above. The display apparatus can be an apparatus with a display function, such as an organic light emitting diode display apparatus, a quantum dot light emitting diode display apparatus, a liquid crystal display panel, an electronic paper display apparatus, etc., or an apparatus of any other type, without being limited in the embodiments of the present disclosure.

The structure, function, and technical effect of the display apparatus provided by the embodiment of the present disclosure can be referred to the corresponding description of the display substrate provided by the foregoing embodiments of the present disclosure, and details are not repeated here.

For example, the display apparatus provided by the embodiments of the present disclosure can be any product or component with a display function, such as display panel, an electronic paper, a mobile phone, a tablet computer, a television, a monitor, a notebook computer, a digital photo frame, a navigator, etc., without being limited in the embodiments of the present disclosure.

At least one embodiment of the present disclosure provides a manufacturing method of a display substrate. The manufacturing method includes forming a display region 201 and a peripheral region at least partially surrounding the display region 201. An opening 201A, a first display region 2011 and a second display region 2012 are formed in the display region 201, and the first display region 2011 and the second display region 2012 are formed at opposite sides of the opening 201A. The first display region 2011, the opening 201A, and the second display region 2012 are sequentially arranged along the first direction R1. The peripheral region includes an opening peripheral region 203 at least partially located in the opening 201A. The display substrate further includes a first wire 2301 and a second wire 2302, and the first wire and the second wire are formed in a same layer. The first wire 2301 and the second wire 2302 are configured to transmit electrical signals for the display region 201. The first wire 2301 and the second wire 2302 pass through the first display region 2011, the opening peripheral region 203 and the second display region 2012, sequentially. In the opening peripheral region 203, the first wire 2301 includes a first bent portion 2311, the second wire 2302 includes a second bent portion 2312, and the first bent portion 2311 and the second bent portion are arranged side by side along the first direction R1.

For example, in some embodiments, the first bent portion 2311 is formed to include at least one S-shaped bent portion; or, the second bent portion 2312 is formed to include at least one S-shaped bent portion; or, each of the first bent portion 2311 and the second bent portion 2312 is formed to include at least one S-shaped bent portion.

For example, in some embodiments, forming the opening peripheral region 203 further includes forming a semiconductor pattern 220 and a conductive pattern 240. The semiconductor pattern 220 is formed on the base substrate 210. The first wire 2301 and the second wire 2302 are formed on a side of the semiconductor pattern 220 away from the base substrate 210. The conductive pattern 240 is formed on a side of the first wire 2301 and the second wire 2302 away from the semiconductor pattern 220. In the direction perpendicular to the base substrate 210, the first bent portion 2311 of the first wire 2301 is spaced apart and insulated from at least one of the semiconductor pattern 220 and the conductive pattern 240 to be capable of forming a capacitor. The second bent portion 2312 of the second wire 2302 is spaced apart and insulted from at least one of the semiconductor pattern 220 and the conductive pattern 240 to be capable of forming a capacitor.

For example, in some embodiments, the forming the display region 201 includes forming a pixel circuit, and the pixel circuit includes a thin film transistor TFT and a storage capacitor Cst. The thin film transistor TFT includes an active layer 120, a gate electrode 121, and source-drain electrodes 122/123. The storage capacitor Cst includes a first capacitor plate CE1 and a second capacitor plate CE2. The gate electrode 121 is formed on a same layer as the first capacitor plate CE1, the first wire 2301 and the second wire 2302 are formed on a same layer as the second capacitor plate CE2, the semiconductor pattern 220 is formed on a same layer as the active layer 120, and the conductive pattern 240 is formed on a same layer as the source-drain electrodes.

Hereafter, the display substrate and the manufacturing method thereof will be described in combination with the pixel circuit and layout in the display substrate.

Figure 8:
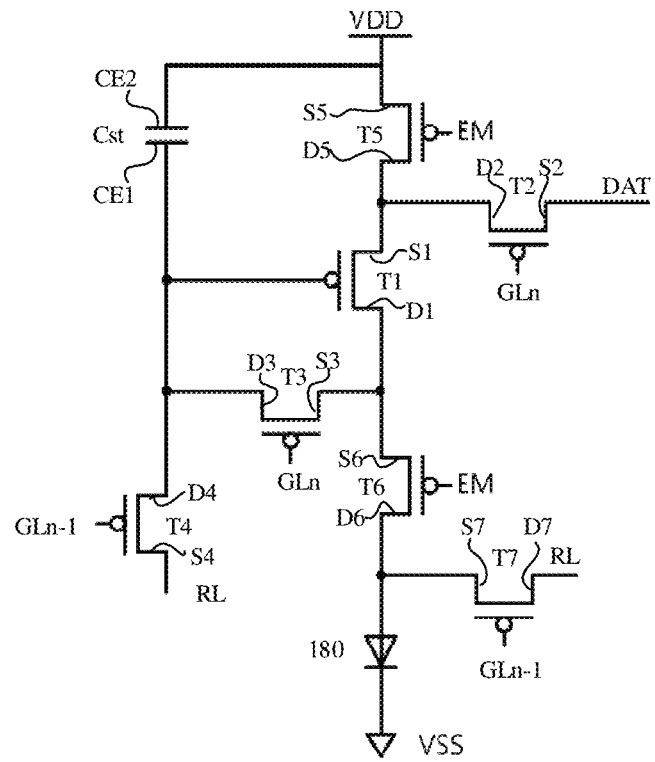
FIG. 8 is an equivalent circuit diagram of a pixel circuit in a display substrate provided by at least one embodiment of the present disclosure.

FIG. 8 is an equivalent circuit diagram of a pixel circuit in a display substrate provided by at least one embodiment of the present disclosure, and FIGS. 9A-9E are schematic diagrams of various layers of a pixel circuit in a display substrate provided by some embodiments of the present disclosure.

In some embodiments, as shown in FIG. 8, the pixel circuit includes a plurality of thin film transistors T1, T2, T3, T4, T5, T6 and T7, a plurality of signal lines connected to the plurality of thin film transistors T1, T2, T3, T4, T5, T6 and T7, and a storage capacitor Cst. The plurality of signal lines include a gate line GL (that is, a scan signal line), a light emitting control line EM, an initialization line RL, a data line DAT, and a first power line VDD. The gate line GL can include a first gate line GLn and a second gate line GLn−1. For example, the first gate line GLn can be configured to transmit a gate scan signal, and the second gate line GLn−1 can be configured to transmit a reset signal. The light emitting control line EM can be configured to transmit a light emitting control signal. Therefore, the pixel circuit is a 7T1C pixel circuit.

It should be noted that the embodiments of the present disclosure include but are not limited thereto, and the pixel circuit can also adopt a circuit structure of any other type, such as a 7T2C structure or a 9T2C structure, etc., without being limited in the embodiments of the present disclosure.

For example, the first gate lines GLn of the pixel circuits corresponding to each row of sub-pixels located on the left and right sides of the opening of the display region 201 can be electrically connected through the wire 230, so as to transmit the gate scan signal, thereby achieving the compensation effect of the gate scan signal.

For example, as shown in FIG. 8, a first gate electrode G1 of the first thin film transistor T1 is electrically connected to a third drain electrode D3 of the third thin film transistor T3 and a fourth drain electrode D4 of the fourth thin film transistor T4. A first source electrode S1 of the first thin film transistor T1 is electrically connected to a second drain electrode D2 of the second thin film transistor T2 and a fifth drain electrode D5 of the fifth thin film transistor T5. A first drain electrode D1 of the first thin film transistor T1 is electrically connected to a third source electrode S3 of the third thin film transistor T3 and a sixth source electrode S6 of the sixth thin film transistor T6.

For example, as shown in FIG. 8, a second gate electrode G2 of the second thin film transistor T2 is configured to be electrically connected to the first gate line GLn to receive a gate scan signal, a second source electrode S2 of the second thin film transistor T2 is configured to be electrically connected to the data line DAT to receive a data signal, and a second drain electrode D2 of the second thin film transistor T2 is electrically connected to the first source electrode S1 of the first thin film transistor T1.

For example, as shown in FIG. 8, a third gate electrode G3 of the third thin film transistor T3 is configured to be electrically connected to the first gate line GLn, a third source electrode S3 of the third thin film transistor T3 is electrically connected to the first drain electrode D1 of the first thin film transistor T1, and a third drain electrode D3 of the third thin film transistor T3 is electrically connected to the first gate electrode G1 of the first thin film transistor T1.

For example, as shown in FIG. 8, a fourth gate electrode G4 of the fourth thin film transistor T4 is configured to be electrically connected to the second gate line GLn−1 to receive a reset signal, a fourth source electrode S4 of the fourth thin film transistor T4 is configured to be electrically connected to the initialization line RL to receive an initialization signal, and a fourth drain electrode D4 of the fourth thin film transistor T4 is electrically connected to the first gate electrode G1 of the first thin film transistor T1.

For example, as shown in FIG. 8, a fifth gate electrode G5 of the fifth thin film transistor T5 is configured to be electrically connected to the light emitting control line EM to receive a light emitting control signal, a fifth source electrode S5 of the fifth thin film transistor T5 is configured to be connected to the first power line VDD to receive the first power signal, and a fifth drain electrode D5 of the fifth thin film transistor T5 is electrically connected to the first source electrode S1 of the first thin film transistor T1.

For example, as shown in FIG. 8, a sixth gate electrode G6 of the sixth thin film transistor T6 is configured to be electrically connected to the light emitting control line EM to receive the light emitting control signal, a sixth source electrode S6 of the sixth thin film transistor T6 is connected to the first drain electrode D1 of the first thin film transistor T1, and a sixth drain D6 of the sixth thin film transistor T6 is electrically connected to a first display electrode (e.g., an anode) of the light emitting element 180.

For example, as shown in FIG. 8, a seventh gate electrode G7 of the seventh thin film transistor T7 is configured to be electrically connected to the second gate line GLn−1 to receive the reset signal, a seventh source electrode S7 of the seventh thin film transistor T7 is electrically connected to the first display electrode (e.g., the anode 181) of the light emitting element 180, and a seventh drain electrode D7 of the seventh thin film transistor T7 is configured to be electrically connected to the initialization line RL to receive the initialization signal. For example, the seventh drain electrode D7 of the seventh thin film transistor T7 can be electrically connected to the initialization line RL by being connected to the fourth source electrode S4 of the fourth thin film transistor T4.

For example, as shown in FIG. 8, the storage capacitor Cst includes a first capacitor electrode CE1 and a second capacitor electrode CE2. The second capacitor electrode CE2 is electrically connected to the first power line VDD, and the first capacitor electrode CE1 is electrically connected to the first gate electrode G1 of the first thin film transistor T1 and the third drain electrode D3 of the third thin film transistor T3.

For example, as shown in FIG. 8, a second display electrode (e.g., the cathode 183) of the light emitting element 180 is electrically connected to a second power line VSS.

It should be noted that one of the first power line VDD and the second power line VSS is a power line that provides a high voltage, and the other of the first power line VDD and the second power line VSS is a power line that provides a low voltage. In the embodiment shown in FIG. 8, the first power line VDD provides a constant first voltage, and the first voltage is a positive voltage; and the second power line VSS provides a constant second voltage, and the second voltage can be a negative voltage, etc. For example, in some examples, the second voltage can be a ground voltage.

It should be noted that the above reset signal and the above initialization signal can be the same signal.

For example, the cathode 183 of the display substrate 20 can be configured to receive a second voltage provided by the second power line VSS. In the case where the power line pattern 270 and the cathode 183 are arranged on a same layer and are electrically connected to each other, the power line pattern 270, the conductive pattern 240 and the semiconductor pattern 220 electrically connected to the conductive pattern 240 are applied with the second voltage, so that a capacitor is formed between the wire 230, which is electrically connected to the first gate line GLn and transmits the gate scan signal, and the semiconductor line 221 in the semiconductor pattern 220, thus achieving the compensation effect. Or, in the case where the power line pattern 270 and the first power line VDD are arranged on a same layer and are electrically connected to each other, the power line pattern 270, the conductive pattern 240 and the semiconductor pattern 220 electrically connected to the conductive pattern 240 are applied with the first voltage, so that a capacitor is formed between the wire 230, which is electrically connected to the first gate line GLn and transmits the gate scan signal, and the semiconductor line 221 in the semiconductor pattern 220, thus achieving the compensation effect.

It should be noted that transistors can be divided into N-type transistors and P-type transistors according to the characteristics of transistors. For the sake of clarity, the embodiments of the present disclosure illustrate the technical solutions of the present disclosure in detail by taking that the transistors are P-type transistors (e.g., P-type TFTs) as an example. That is, in the description of the present disclosure, the first transistor T1, the second transistor T2, the third transistor T3, the fourth transistor T4, the fifth transistor T5, the sixth transistor T6 and the seventh transistor T7, etc., can all be P-type transistors. However, the transistors in the embodiments of the present disclosure are not limited to P-type transistors, and those skilled in the art can also use N-type transistor(s) (e.g., N-type TFTs) to implement the functions of one or more transistors in the embodiments of the present disclosure according to actual needs.

It should be noted that the transistors adopted in the embodiments of the present disclosure can be thin film transistors or field effect transistors or other switching elements with the same characteristics. The thin film transistors can include oxide semiconductor thin film transistors, amorphous silicon thin film transistors, or poly-silicon thin film transistors, etc. The source electrode and the drain electrode of a transistor can be symmetrical in structure, so the source electrode and the drain electrode may be indistinguishable in physical structure. In the embodiments of the present disclosure, the source electrode and the drain electrode of all or part of the transistors can be interchanged according to actual needs.

Figure 9A:
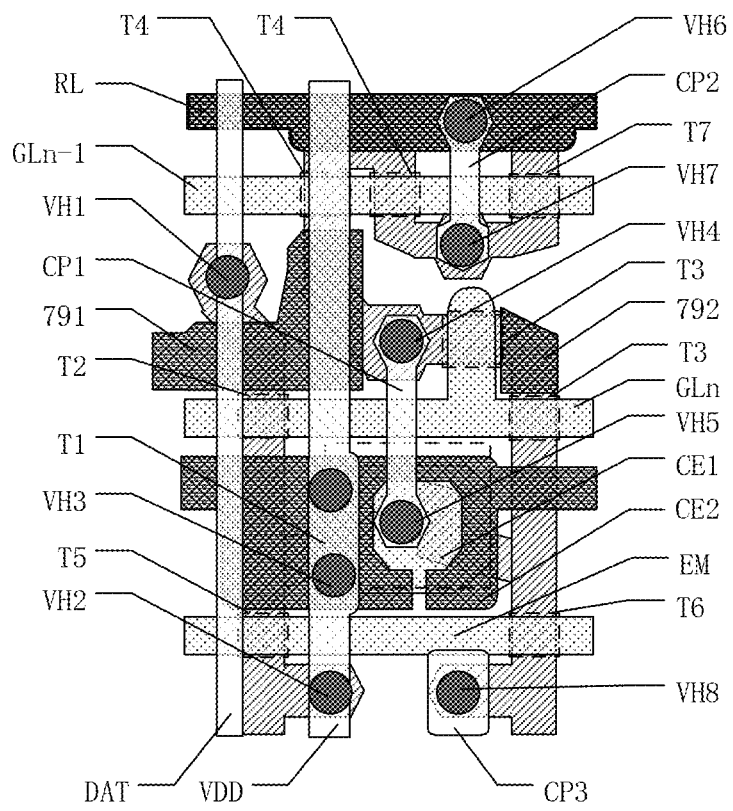
FIGS. 9A-9E are schematic diagrams of various layers of a pixel circuit in a display substrate provided by some embodiments of the present disclosure.

In some embodiments, as shown in FIG. 9A, the pixel circuit includes the thin film transistors T1, T2, T3, T4, T5, T6 and T7, the storage capacitor Cst, and the first gate line GLn, the second gate line GLn−1, the light emitting control line EM, the initialization line RL, the data line DAT and the first power line VDD, which are connected to the plurality of thin film transistors T1, T2, T3, T4, T5, T6, and T7. Hereinafter, the structure of the pixel circuit will be described with reference to FIG. 8 and FIGS. 9A-9E.

For example, FIG. 9A is a schematic diagram of a stacked positional relationship between a semiconductor layer, a first conductive layer, a second conductive layer and a third conductive layer of the pixel circuit.

Figure 9B:
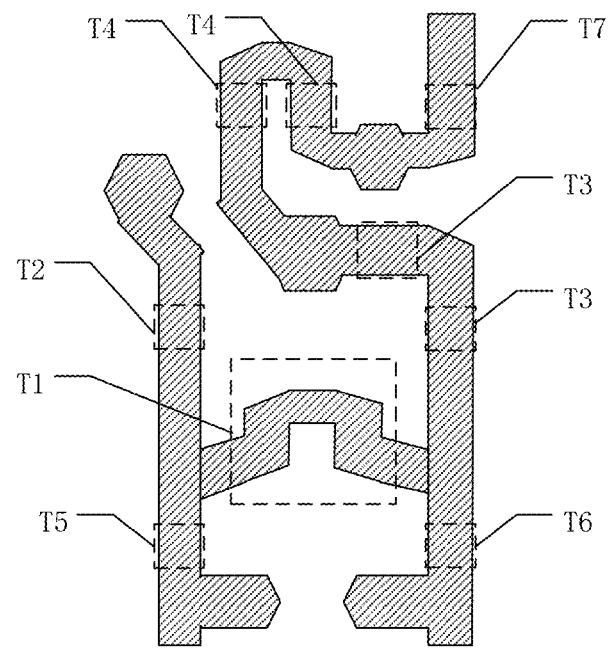

FIG. 9B shows a semiconductor layer of the pixel circuit. For example, the semiconductor layer shown in FIG. 8B includes the active layer 120 shown in FIG. 6, and the active layer 120 is, for example, the active layer of the sixth thin film transistor T6. As shown in FIG. 8B, the semiconductor layer can be formed by a patterning process using a semiconductor material layer. The semiconductor layer can be used to manufacture the active layers of the first thin film transistor T1, the second thin film transistor T2, the third thin film transistor T3, the fourth thin film transistor T4, the fifth thin film transistor T5, the sixth thin film transistor T6 and the seventh thin film transistor T7. Each active layer can include a source region, a drain region, and a channel region between the source electrode region and the drain electrode region. For example, the semiconductor layer can be made of amorphous silicon, poly-silicon, or an oxide semiconductor material, etc. It should be noted that the source region and the drain region can be regions doped with N-type impurities or P-type impurities.

For example, the semiconductor layer of the pixel circuit can be formed on a same layer as the semiconductor pattern 220 in the opening peripheral region 203, that is, the semiconductor layer of the pixel circuit and the semiconductor pattern in the opening peripheral region 203 can be formed of a same semiconductor material layer by a same patterning process. In this case, the semiconductor pattern 220 in the opening peripheral region 203 is only formed at the position where the first part 231 of the wire 230 will be formed later, while the semiconductor material corresponding to the formation position of the second part 232 of the wire 230 is etched, so that the semiconductor pattern 220 does not overlap with the second part 232 of the wire 230 that will be formed later.

In the display substrate provided by some embodiments of the present disclosure, an insulating layer is formed on the semiconductor layer described above, and the insulating layer includes a part of the first insulating layer 250 and the first gate insulating layer 151 as shown in FIG. 6. The insulating layer is not shown in FIGS. 9A-9E.

Figure 9C:
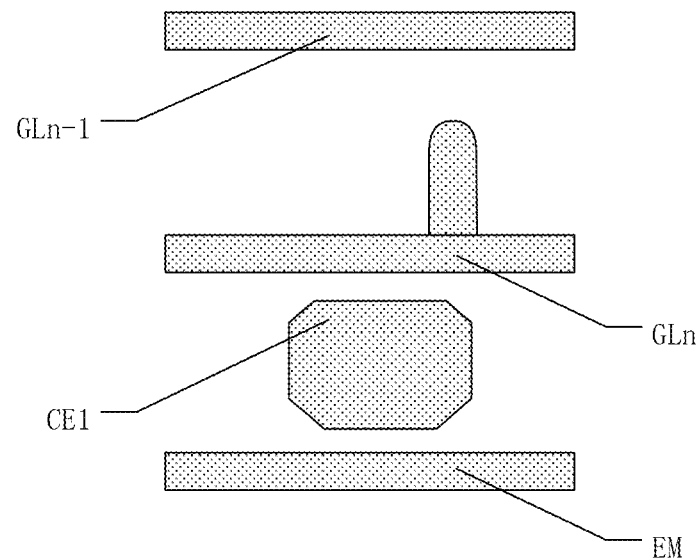

FIG. 9C shows a first conductive layer of the pixel circuit. For example, as shown in FIG. 9C, the first conductive layer of the pixel circuit is arranged on the insulating layer described above, so as to be insulated from the semiconductor layer shown in FIG. 9B. The first conductive layer can include the first capacitor electrode CE1 of the storage capacitor Cst, the first gate line GLn, the second gate line GLn−1, the light emitting control line EM, the gate electrode of the first thin film transistor T1, the gate electrode of the second thin film transistor T2, the gate electrode of the third thin film transistor T3, the gate electrode of the fourth thin film transistor T4, the gate electrode of the fifth thin film transistor T5, the gate electrode of the sixth thin film transistor T6 and the gate electrode of the seventh thin film transistor T7 (e.g., the first gate electrode G1, the second gate electrode G2, the third gate electrode G3, the fourth gate electrode G4, the fifth gate electrode G5, the sixth gate electrode G6 and the seventh gate electrode G7 described above). As shown in FIG. 9C, the gate electrodes of the second thin film transistor T2, the fourth thin film transistor T4, the fifth thin film transistor T5, the sixth thin film transistor T6 and the seventh thin film transistor T7 are portions of the first gate line GLn or the second gate line GLn−1 that overlap with the semiconductor layer. The third thin film transistor T3 can be a thin film transistor with a dual-gate structure, one gate electrode of the third thin film transistor T3 can be a portion of the first gate line GLn that overlaps with the semiconductor layer, and the other gate electrode of the third thin film transistor T3 can be a protrusion protruding from the first gate line GLn. The gate electrode of the first thin film transistor T1 can be the first capacitor electrode CE1. The fourth thin film transistor T4 can be a thin film transistor with a dual-gate structure, and the two gate electrodes thereof are respectively the portions of the second gate line GLn−1 that overlap with the semiconductor layer.

In the display substrate provided by some embodiments of the present disclosure, another insulating layer is formed on the first conductive layer described above, and this insulating layer includes another part of insulating layer 250 and the second gate insulating layer 152 as shown in FIG. 6. This insulating layer is not shown in FIGS. 9A-9E.

Figure 9D:
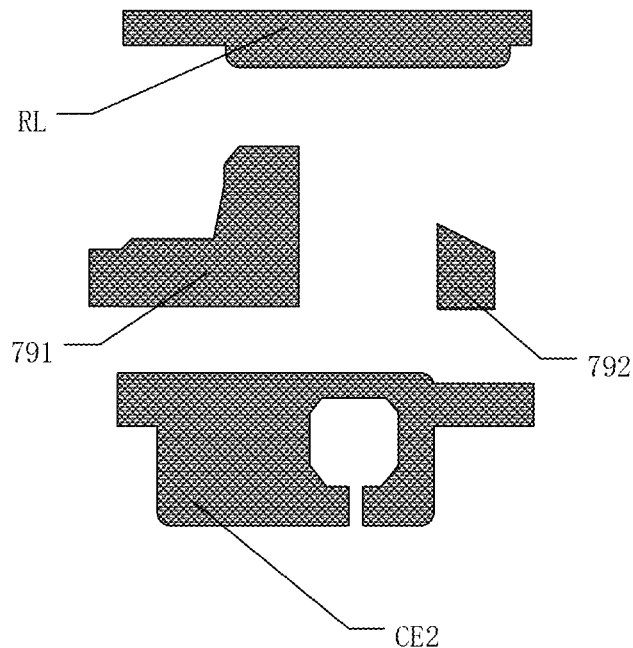

FIG. 9D shows a second conductive layer of the pixel circuit. For example, as shown in FIG. 9D, the second conductive layer of the pixel circuit includes the second capacitor electrode CE2 of the storage capacitor Cst and the initialization line RL. The second capacitor electrode CE2 at least partially overlaps with the first capacitor electrode CE1 to form the storage capacitor Cst.

For example, the second capacitor electrode CE2 shown in FIG. 10D has a notch. In some embodiments, the second capacitor electrode CE2 may not have the notch. The embodiments of the present disclosure do not limit the specific structure of the second capacitor electrode CE2.

For example, the wire 230 in the opening peripheral region 203 is formed on a same layer as the second conductive layer of the pixel circuit, that is, the wire 230 in the opening peripheral region 203 and the second conductive layer of the pixel circuit are formed of a same conductive material layer by a same patterning process. That is, the wire 230, the second capacitor electrode CE2 and the initialization line RL are formed of a same conductive material layer by a same patterning process.

For example, forming the line 230 in the opening peripheral region 203 includes forming a first wire 2301 and a second wire 2302, and the first wire 2301 and the second wire 2302 are configured to transmit electrical signals for the display region 201. The first wire 2301 includes a first bent portion 2311, the second wire 2302 includes a second bent portion 2312, and the first bent portion 2311 and the second bent portion are arranged side by side along the first direction R1. For example, in some embodiments, the first bent portion 2311 is formed to include at least one S-shaped bent portion; or the second bent portion 2312 is formed to include at least one S-shaped bent portion; or each of the first bent portion 2311 and the second bent portion 2312 is formed to include at least one S-shaped bending portion (as shown in the figure, each of the first bending portion 2311 and the second bending portion 2312 includes one S-shaped bending portion).

For example, in some embodiments, the second conductive layer can further include a first light shielding portion 791 and a second light shielding portion 792. The orthographic projection of the first light shielding portion 791 on the base substrate 210 covers the active layer of the second thin film transistor T2, and the active layer between the drain electrode of the third thin film transistor T3 and the drain electrode of the fourth thin film transistor T4, thereby preventing external light from affecting the active layers of the second thin film transistor T2, the third thin film transistor T3 and the fourth thin film transistor T4. The orthographic projection of the second light shielding portion 792 on the base substrate 210 covers the active layer between the two gate electrodes of the third thin film transistor T3, thereby preventing external light from affecting the active layer of the third thin film transistor T3. The first light shielding portion 791 can be an integral structure with the second light shielding portion 792 of an adjacent pixel circuit, and is electrically connected to the first power line VDD through a via hole penetrating the insulating layer.

In the display substrate provided by some embodiments of the present disclosure, another insulating layer is formed on the second conductive layer described above, and this insulating layer includes the second insulating layer 260 and the interlayer insulating layer 160 as shown in FIG. 6. This insulating layer is not shown in FIGS. 9A-9E.

Figure 9E:
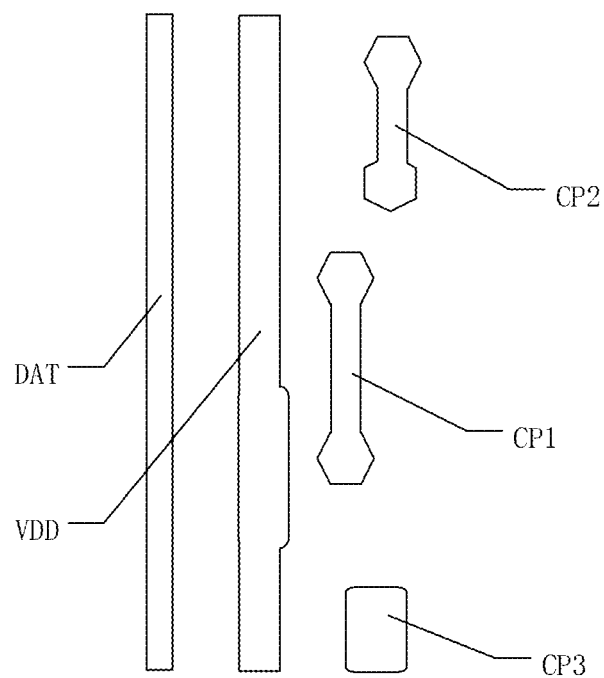

FIG. 9E shows a third conductive layer of the pixel circuit. For example, as shown in FIG. 9E, the third conductive layer of the pixel circuit includes a data line DAT and a first power line VDD. As shown in FIG. 9A and FIG. 9E, the data line DAT is connected to the source region of the second thin film transistor T2 in the semiconductor layer through at least one via hole (e.g., via hole VH1) in the first gate insulating layer, the second gate insulating layer and the interlayer insulating layer. The first power line VDD is connected to the source region of the fifth thin film transistor T5 in the semiconductor layer through at least one via hole (e.g., via hole VH2) in the first gate insulating layer, the second gate insulating layer and the interlayer insulating layer. The first power line VDD is connected to the second capacitor electrode CE2 in the second conductive layer through at least one via hole (e.g., via hole VH3) in the interlayer insulating layer.

For example, in some embodiments (corresponding to the example shown in FIG. 5), the power line pattern 270 and the conductive pattern 240 in the opening peripheral region 203 are formed on a same layer as the third conductive layer of the pixel circuit, that is, they are formed of a same conductive material layer by a same patterning process. For example, the power line pattern 270 and the conductive pattern 240 in the opening peripheral region 203 and the first power line VDD are formed on a same layer and electrically connected, so that the conductive pattern 240, the power line pattern 270 and the first power line VDD transmit the same electrical signal. For example, in the case where the semiconductor pattern 220 and the conductive pattern 240 are electrically connected, the semiconductor pattern 220, the conductive pattern 240, the power line pattern 270 and the first power line VDD all transmit the same electrical signal.

For example, the third conductive layer further includes a first connection portion CP1, a second connection portion CP2 and a third connection portion CP3. One end of the first connection portion CP1 is connected to the drain region of the third thin film transistor T3 in the semiconductor layer through at least one via hole (e.g., via hole VH4) in the first gate insulating layer, the second gate insulating layer and the interlayer insulating layer, and the other end of the first connection portion CP1 is connected to the gate electrode of the first thin film transistor T1 in the first conductive layer through at least one via hole (e.g., via hole VH5) in the second gate insulating layer and the interlayer insulating layer. One end of the second connection portion CP2 is connected to the initialization line RL through a via hole (e.g., via hole VH6) in the interlayer insulating layer, and the other end of the second connection portion CP2 is connected to the source region of the seventh thin film transistor T7 and the source region of the fourth thin film transistor T4 in the semiconductor layer through at least one via hole (e.g., via hole VH7) in the first gate insulating layer, the second gate insulating layer and the interlayer insulating layer. The third connection portion CP3 is connected to the drain region of the sixth thin film transistor T6 in the semiconductor layer through at least one via hole (e.g., via hole VH8) in the first gate insulating layer, the second gate insulating layer and the interlayer insulating layer.

Figure 10:
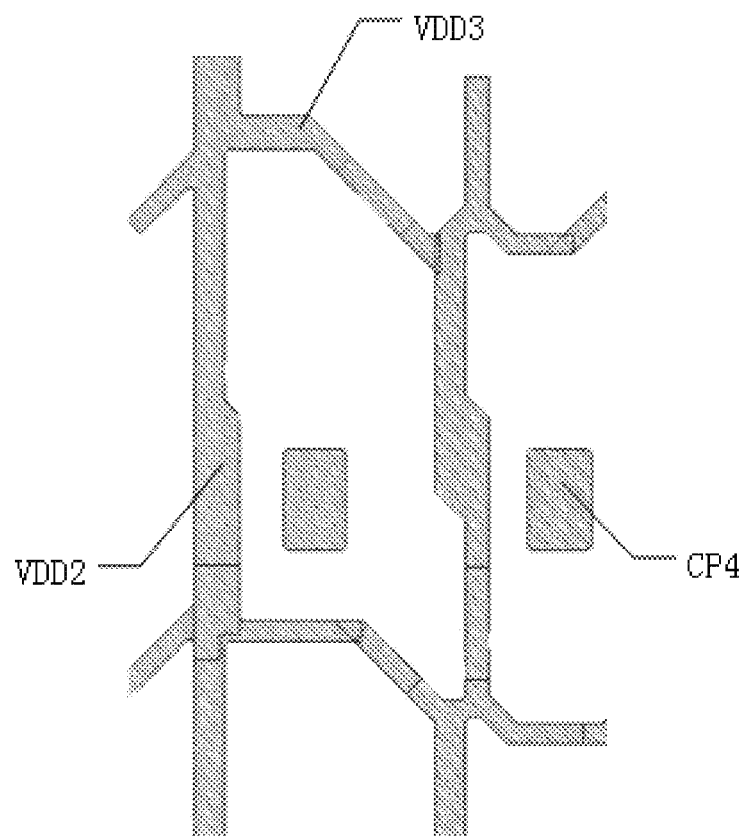
FIG. 10 is a schematic diagram of a conductive layer of a pixel circuit in a display substrate provided by some embodiments of the present disclosure.

For example, in some embodiments, the pixel circuit of the display substrate can further include a fourth conductive layer. For example, FIG. 10 shows a fourth conductive layer of the pixel circuit. As shown in FIG. 10, the fourth conductive layer includes a second power line VDD2 and a third power line VDD3; the second power line VDD2 extends in the vertical direction in the figure, the third power line VDD3 is intersected with the second power line VDD2. For example, the second power line VDD2 and the third power line VDD3 are electrically connected to each other or are an integrated structure.

For example, in some embodiments, the second power line VDD2 and the third power line VDD3 are respectively electrically connected to the first power line VDD through via holes, thereby forming a meshed power line structure. This structure helps to reduce the resistance of the power line, so as to reduce the voltage drop of the power line, and helps to evenly transmit the power voltage to each sub-pixel of the display substrate.

For example, in some embodiments, the fourth conductive layer further includes a fourth connection portion CP4, which is insulated from the second power line VDD2 and the third power line VDD3, and the fourth connection portion CP4 is configured to electrically connect the drain electrode D6 of the sixth transistor T6 to the light emitting element 180. For example, the fourth connection electrode 234 is implemented as the via electrode 171 in the above embodiments, and is configured to electrically connect the anode of the light emitting element to the drain electrode of the thin film transistor.

In the display substrate provided by some embodiments of the present disclosure, a protective layer is formed on the fourth conductive layer described above, and the protective layer includes the planarization layer 112 shown in FIG. 6, which is not shown in FIGS. 9A-9E. For example, a sub-layer of the first barrier wall 281 in the opening peripheral region 203 is formed on a same layer as the protective layer, that is, a sub-layer of the first barrier wall 281 in the opening peripheral region 203 and the protective layer are formed of a same insulating material layer by a same patterning process.

For example, the wire 230 can be connected to the first gate line GLn in the first conductive layer through at least one via hole in the second gate insulating layer.

In some embodiments, as shown in FIG. 6, forming the display substrate further includes forming a buffer layer 111 on the base substrate 210. The buffer layer 111 serves as a transition layer, can prevent harmful substances in the base substrate 210 from intruding into the interior of the display substrate 20, and can also increase the adhesion of the film layers in the display substrate 20 to the base substrate 210. For example, the material of the buffer layer 111 can include a single-layer or multi-layer structure formed of insulating materials, such as silicon oxide, silicon nitride, silicon oxynitride, etc.

For example, structures, such as a pixel defining layer, a spacer, a barrier wall, a light emitting element, an encapsulation layer, etc., can be formed on the protective layer of the display substrate. The formation manners of these structures can refer to related technologies, without being limited in the embodiments of the present disclosure.

Figure 11A:
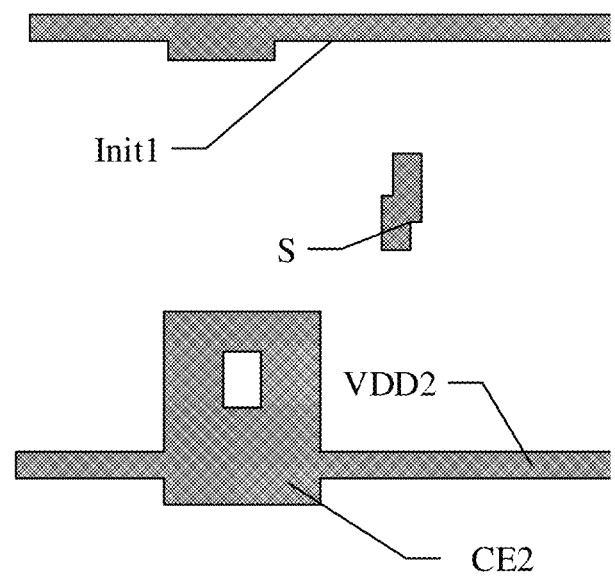
FIG. 11A is another schematic diagram of a second conductive layer of a pixel circuit in a display substrate provided by some embodiments of the present disclosure.

For example, in some embodiments, the various conductive layers described above can also adopt other layout patterns. For example, FIG. 11A shows a planar view of another second conductive layer. As shown in FIG. 11A, in this example, the second conductive layer includes the second capacitor electrode CE2 of the storage capacitor Cst, the reset signal line Initl, the second power signal line VDD2, and the light shielding portion S. The second power signal line VDD2 and the second capacitor electrode CE2 are integrally formed.

Figure 11B:
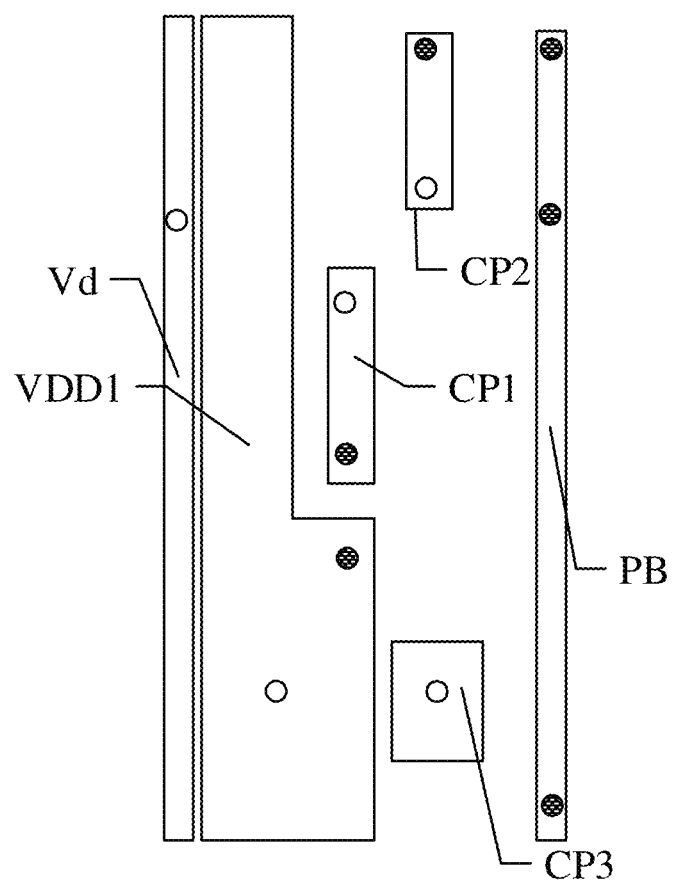
FIG. 11B is another schematic diagram of a third conductive layer of a pixel circuit in a display substrate provided by some embodiments of the present disclosure.

For example, FIG. 11B shows a planar view of another third conductive layer. As shown in FIG. 11B, the third conductive layer includes the data line Vd, the first power signal line VDD1 and a shield line PB. The data line Vd, the first power signal line VDD1 and the shielding line PB all extend in a same direction, for example, in the vertical direction in the figure. For example, the third conductive layer can further include the first connection portion CP1, the second connection portion CP2 and the third connection portion CP3, which are configured to electrically connect different lines or electrodes.

Figure 11C:
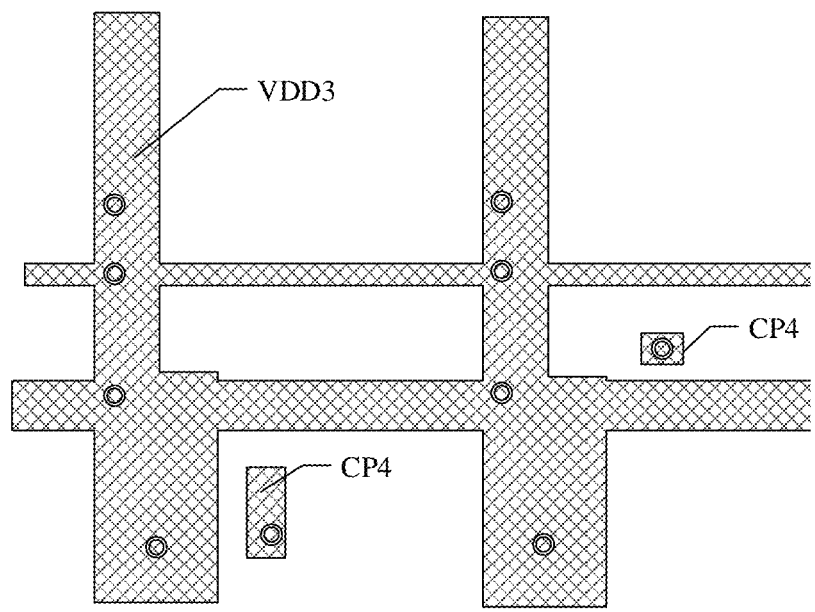
FIG. 11C is another schematic diagram of a fourth conductive layer of a pixel circuit in a display substrate provided by some embodiments of the present disclosure.

For example, FIG. 11C shows a planar view of another fourth conductive layer. As shown in FIG. 11C, the fourth conductive layer includes a fourth connection portion CP4, and a third power signal line VDD3 which is distributed crosswise along the vertical direction and the horizontal direction in the figure. For example, in some examples, the third power signal line VDD3 can be connected in parallel with the first power signal line VDD1 to form a meshed power structure, which is beneficial to reduce the resistance of the power signal line.

In addition, the embodiments of the present disclosure do not specifically limit the material of each structure or functional layer, and examples of the materials of these structures or functional layers can be referred to the above-mentioned embodiments, which will not be repeated here.

The following statements should be noted:

(1) The accompanying drawings of the embodiments of the present disclosure involve only the structure(s) in connection with the embodiment(s) of the present disclosure, and other structure(s) can be referred to common design(s).

(2) For the purpose of clarity only, in the accompanying drawings used to describe the embodiments of the present disclosure, the thicknesses of layers or regions are enlarged or reduced, that is, these accompanying drawings are not drawn according to actual scale. It should be understood that when a component such as a layer, film, region, or substrate is referred to as being "on" or "under" another element, the component may be "directly" "on" or "under" the another component or an intermediate component may exist therebetween.

(3) In case of no conflict, features in one embodiment or in different embodiments can be combined to obtain a new embodiment.

What have been described above are only specific implementations of the present disclosure, and the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be determined based on the protection scope of the claims.

What is claimed is:

1. A display substrate, comprising: a display region and a peripheral region at least partially surrounding the display region,
    wherein the display region comprises an opening, a first display region and a second display region, the first display region and the second region are located at opposite sides of the opening, the first display region, the opening and the second display region are sequentially arranged along a first direction, and the peripheral region comprises an opening peripheral region corresponding to the opening of the display region and at least partially overlapping the opening of the display region;
    the display substrate further comprises a first wire and a second wire, the first wire and the second wire are arranged on a same layer, and the first wire and the second wire are configured to transmit electrical signals for the display region;
    the first wire and the second wire pass through the first display region, the opening peripheral region and the second display region, sequentially; and
    in the opening peripheral region, the first wire comprises a first bent portion, the second wire comprises a second bent portion, and the first bent portion and the second bent portion are arranged side by side along the first direction, wherein the first bent portion comprises at least one S-shaped bent portion; or
    the second bent portion comprises at least one S-shaped bent portion; or
    each of the first bent portion and the second bent portion comprises at least one S-shaped bent portion.

2. The display substrate according to claim 1, wherein the first display region and the second display region comprise a plurality of rows of sub-pixels separated by the opening,
    the first wire is configured to provide a scan signal for a first row of sub-pixels arranged in the first direction in the first display region and the second display region, and
    the second wire is configured to provide a scan signal for a second row of sub-pixels arranged in the first direction in the first display region and the second display region.

3. The display substrate according to claim 2, wherein the opening peripheral region further comprises a semiconductor pattern and a conductive pattern;
    the semiconductor pattern is located on a base substrate, the first wire and the second wire are located on a side of the semiconductor pattern away from the base substrate, and the conductive pattern is located on a side of the first wire and the second wire away from the semiconductor pattern; and
    in a direction perpendicular to the base substrate, the first wire is spaced apart and insulated from at least one of the semiconductor pattern and the conductive pattern to be capable of forming a capacitor, and the second wire is spaced apart and insulated from at least one of the semiconductor pattern and the conductive pattern to be capable of forming a capacitor.

4. The display substrate according to claim 3, wherein in the direction perpendicular to the base substrate, the first bent portion of the first wire is spaced apart and insulated from at least one of the semiconductor pattern and the conductive pattern to be capable of forming a capacitor, and the second bent portion of the second wire is spaced apart and insulated from at least one of the semiconductor pattern and the conductive pattern to be capable of forming a capacitor.

5. The display substrate according to claim 3, further comprising a third wire, which is arranged on a same layer as the first wire and the second wire,
    wherein the third wire passes through the first display region, the opening peripheral region and the second display region, sequentially, and
    the third wire extends along the first direction, and is configured to provide a scan signal for a third row of pixels arranged along the first direction in the first display region and the second display region, and the third wire is spaced apart and insulated from at least one of the semiconductor pattern and the conductive pattern to be capable of forming a capacitor.

6. The display substrate according to claim 5, wherein a count of sub-pixels comprised in the third row of sub-pixels is greater than a count of sub-pixels comprised in the first row of sub-pixels; or
    the count of sub-pixels comprised in the third row of sub-pixels is greater than a count of sub-pixels comprised in the second row of sub-pixels; or
    the count of sub-pixels comprised in the third row of sub-pixels is greater than the count of sub-pixels comprised in the first row of sub-pixels, and greater than the count of sub-pixels comprised in the second row of sub-pixels.

7. The display substrate according to claim 5, wherein the display region further comprises a third display region, and two opposite edges, extending along a second direction perpendicular to the first direction, of the third display region, are respectively aligned with an edge, extending along the second direction and away from the opening, of the first display region and an edge, extending along the second direction and away from the opening, of the second display region; and
    the third display region comprises a plurality of sub-pixels arranged in multiple rows and multiple columns, and further comprises a plurality of fourth wires extending along the first direction, and each of the plurality of fourth wires is configured to provide a scan signal for each row of sub-pixels among the multiple rows and multiple columns of sub-pixels.

8. The display substrate according to claim 7, wherein a count of sub-pixels comprised in each row of sub-pixels among the multiple rows and multiple columns of sub-pixels is greater than a count of sub-pixels comprised in the first row of sub-pixels, greater than a count of sub-pixels comprised in the second row of sub-pixels, and greater than a count of sub-pixels comprised in the third row of sub-pixels.

9. The display substrate according to claim 3, wherein the semiconductor pattern comprises a plurality of semiconductor lines extending along a second direction, the second direction is perpendicular to the first direction, and the conductive pattern is continuously arranged on a side of the first wire and the second wire away from the semiconductor pattern.

10. The display substrate according to claim 3, further comprising: a first insulating layer and a second insulating layer,
wherein the first insulating layer is located on a side of the semiconductor pattern away from the base substrate, the first wire and the second wire are located on a side of the first insulating layer away from the semiconductor pattern;
the second insulating layer is located on a side of the first wire and the second wire away from the first insulating layer;
a via hole is provided in the first insulating layer and the second insulating layer, and the semiconductor pattern and the conductive pattern are electrically connected through the via hole in the first insulating layer and the second insulating layer.

11. The display substrate according to claim 3, wherein the display region comprises a plurality of sub-pixels, and each of the plurality of sub-pixels comprises a pixel circuit, the pixel circuit comprises a thin film transistor and a storage capacitor, the thin film transistor comprises an active layer, a gate electrode and source-drain electrodes, and the storage capacitor comprises a first capacitor plate and a second capacitor plate; and
the gate electrode is arranged on a same layer as the first capacitor plate, and the first wire and the second wire are arranged on a same layer as the second capacitor plate.

12. The display substrate according to claim 11, wherein the semiconductor pattern is arranged on a same layer as the active layer, and the conductive pattern is arranged on a same layer as the source-drain electrodes.

13. The display substrate according to claim 11, wherein the opening peripheral region further comprises a power line pattern electrically connected to the conductive pattern, the power line pattern is configured to provide an electrical signal for the conductive pattern, and the display region further comprises a first power line electrically connected to the pixel circuit, and the power line pattern and the first power line are arranged on a same layer.

14. The display substrate according to claim 11, wherein the opening peripheral region further comprises a power line pattern electrically connected to the conductive pattern, the power line pattern is configured to provide an electrical signal for the conductive pattern,
each of the plurality of sub-pixels further comprises a light emitting element, the light emitting element comprises a cathode, an anode, and a light emitting layer between the cathode and the anode, and one of the cathode and the anode is electrically connected to the pixels circuit, and the power line pattern and the anode are arranged on a same layer.

15. A display apparatus, comprising a display substrate, wherein the display substrate comprises:
a display region and a peripheral region at least partially surrounding the display region,
wherein the display region comprises an opening, a first display region and a second display region, the first display region and the second region are located at opposite sides of the opening, the first display region, the opening and the second display region are sequentially arranged along a first direction, and the peripheral region comprises an opening peripheral region corresponding to the opening of the display region and at least partially overlapping the opening of the display region;
the display substrate further comprises a first wire and a second wire, the first wire and the second wire are arranged on a same layer, and the first wire and the second wire are configured to transmit electrical signals for the display region;
the first wire and the second wire pass through the first display region, the opening peripheral region and the second display region, sequentially; and
in the opening peripheral region, the first wire comprises a first bent portion, the second wire comprises a second bent portion, and the first bent portion and the second bent portion are arranged side by side along the first direction, wherein the first bent portion comprises at least one S-shaped bent portion; or
the second bent portion comprises at least one S-shaped bent portion; or
each of the first bent portion and the second bent portion comprises at least one S-shaped bent portion.

16. A manufacturing method of a display substrate, comprising: forming a display region and a peripheral region at least partially surrounding the display region,
wherein an opening, a first display region, and a second display region are formed in the display region, and the first display region and the second display region are formed at opposite sides of the opening;
the first display region, the opening and the second display region are sequentially arranged along a first direction, and the peripheral region comprises an opening peripheral region corresponding to the opening of the display region and at least partially overlapping the opening of the display region;
the display substrate further comprises a first wire and a second wire, the first wire and the second wire are arranged on a same layer, and the first wire and the second wire are configured to transmit electrical signals for the display region;
the first wire and the second wire pass through the first display region, the opening peripheral region and the second display region, sequentially; and
in the opening peripheral region, the first wire comprises a first bent portion, the second wire comprises a second bent portion, and the first bent portion and the second bent portion are arranged side by side along the first direction, wherein the first bent portion is formed to comprise at least one S-shaped bent portion; or
the second bent portion is formed to comprise at least one S-shaped bent portion; or
each of the first bent portion and the second bent portion is formed to comprise at least one S-shaped bent portion.

17. The manufacturing method of a display substrate according to claim 16, wherein forming the opening peripheral region further comprises forming a semiconductor pattern and a conductive pattern;

the semiconductor pattern is formed on a base substrate, the first wire and the second wire are formed on a side of the semiconductor pattern away from the base substrate, and the conductive pattern is formed on a side of the first wire and the second wire away from the semiconductor pattern; and in a direction perpendicular to the base substrate, the first bent portion of the first wire is spaced apart and insulated from at least one of the semiconductor pattern and the conductive pattern to be capable of forming a capacitor, and the second bent portion of the second wire is spaced apart and insulated from at least one of the semiconductor pattern and the conductive pattern to be capable of forming a capacitor.

18. The manufacturing method of the display substrate according to claim 17, wherein the forming the display region comprises forming a pixel circuit, the pixel circuit comprises a thin film transistor and a storage capacitor, the thin film transistor comprises an active layer, a gate electrode and source-drain electrodes, and the storage capacitor comprises a first capacitor plate and a second capacitor plate; and the gate electrode is formed on a same layer as the first capacitor plate, the first wire and the second wire are formed on a same layer as the second capacitor plate, the semiconductor pattern is formed on a same layer as the active layer, and the conductive pattern is formed on a same layer as the source-drain electrodes.

\* \* \* \* \*